United States Patent
Koike et al.

(10) Patent No.: US 8,169,079 B2
(45) Date of Patent: May 1, 2012

(54) COPPER INTERCONNECTION STRUCTURES AND SEMICONDUCTOR DEVICES

(75) Inventors: Junichi Koike, Sendai (JP); Akihiro Shibatomi, Sendai (JP)

(73) Assignee: Advanced Interconnect Materials, LLC, Miyagi (JP)

( * ) Notice: Subject to any disclaimer, the term of this patent is extended or adjusted under 35 U.S.C. 154(b) by 60 days.

(21) Appl. No.: 12/589,949

(22) Filed: Oct. 30, 2009

(65) Prior Publication Data

US 2010/0155952 A1 Jun. 24, 2010

(30) Foreign Application Priority Data

Dec. 19, 2008 (JP) ................... 2008-324061

(51) Int. Cl.
*H01L 23/48* (2006.01)
*H01L 29/40* (2006.01)
*H01L 23/52* (2006.01)

(52) U.S. Cl. ........ 257/751; 257/762; 257/758; 257/485; 257/E21.584; 257/E21.021; 438/685; 438/785

(58) Field of Classification Search .............. 257/758, 257/E21.174, E21.175, E21.579, E21.585, 257/E23.152, 751, 762, E21.021, E21.584
See application file for complete search history.

(56) References Cited

U.S. PATENT DOCUMENTS

| | | | |
|---|---|---|---|
| 7,507,666 B2 | 3/2009 | Nakao et al. | |
| 2001/0051420 A1* | 12/2001 | Besser et al. | 438/597 |
| 2002/0109233 A1* | 8/2002 | Farrar | 257/762 |
| 2003/0227068 A1* | 12/2003 | Li et al. | 257/486 |
| 2006/0027931 A1* | 2/2006 | Takewaki et al. | 257/762 |
| 2007/0178713 A1* | 8/2007 | Jeng | 438/787 |

FOREIGN PATENT DOCUMENTS

| | | |
|---|---|---|
| JP | S63-156341 | 6/1988 |
| JP | H01-202841 | 8/1989 |
| JP | H05-047760 | 2/1993 |
| JP | H05-190548 | 7/1993 |
| JP | H06-140398 | 5/1994 |
| JP | H06-310509 | 11/1994 |
| JP | H11-054458 | 2/1999 |
| JP | H11-087349 | 3/1999 |

(Continued)

OTHER PUBLICATIONS

S.M. Sze, Semiconductor Devices—Physics and Technology 2nd Edition, Oct. 5, 2005, pp. 345-346, Sangyo Tosho, Japan.

(Continued)

*Primary Examiner* — Zandra Smith
*Assistant Examiner* — Tsz Chiu
(74) *Attorney, Agent, or Firm* — Sughrue Mion, PLLC

(57) ABSTRACT

A copper interconnection structure includes an insulating layer, an interconnection body including copper in an opening provided on the insulating layer and a barrier layer including a metal element and copper, formed between the insulating layer and the interconnection body. An atomic concentration of the metal element in the barrier layer is accumulated toward an outer surface of the barrier layer facing the insulating layer, and an atomic concentration of copper in the barrier layer is accumulated toward an inner surface of the barrier layer facing the interconnection body. The inner surface of the barrier layer comprises copper surface orientation of {111} and {200}, and an intensity of X-ray diffraction peak from the inner surface of the barrier layer is stronger for the {111} peak than for the {200} peak.

26 Claims, 13 Drawing Sheets

FOREIGN PATENT DOCUMENTS

| | | |
|---|---|---|
| JP | H11-186273 | 7/1999 |
| JP | 2000-150522 | 5/2000 |
| JP | 2003-142487 | 5/2003 |
| JP | 2005-277390 | 10/2005 |
| JP | 2006-049641 | 2/2006 |
| JP | 2007-281485 | 10/2007 |
| JP | H11-297696 | 10/2007 |
| WO | WO 2006/254347 A1 | 3/2006 |
| WO | WO 2007/100125 A1 | 9/2007 |

OTHER PUBLICATIONS

Notice of Reasons for Rejection issued in Japanese Application No. 2008-324061, Dispatch date: Aug. 25, 2009, Japanese Patent Office.

\* cited by examiner

COPPER INTERCONNECTION STRUCTURES AND SEMICONDUCTOR DEVICES

This application claims priority under 35 U.S.C. §119 from Japanese patent application serial No. 2008-324061, filed Dec. 19, 2008, entitled "Method for forming copper interconnection structure, copper interconnection structure and semiconductor device", which is incorporated herein by reference in its entirety.

TECHNICAL FIELD

The present invention relates to a method for forming a copper interconnection provided with an interconnection body made of copper on an electric insulating layer, the copper interconnection structure, and a semiconductor device provided with the copper interconnection on the insulating layer as a circuit interconnection.

BACKGROUND OF THE INVENTION

In order to fabricate semiconductor devices with higher speed and lower power consumption, silicon based integrated circuits (ICs) or thin film transistors (TFTs), or the like (refer to patent document 1) are required featuring a low RC delay interconnection pattern (refer to non-patent document 1 below). Examples of such a semiconductor devices may include high-speed central processing units (CPUs) or large-size liquid crystal display (LCD) devices. Further, in silicon based ultra large integration (ULSI) systems, interconnections with low electrical resistivity are required to increase their integration density even though they may include interconnection with small width. In addition, in order to fabricate semiconductor devices with higher reliability, interconnections made from materials which are superior in electro-migration (EM) and stress-migration (SM) resistance are required (refer to patent document 1 below).

[Patent document 1] Japanese unexamined patent application no. H11-186273

[Non-Patent Document 1] "Semiconductor Device ($2^{nd}$ edition)—Physics and Technology" by S. M. Sze (Oct. 5, 2005, Sangyo Tosho, Co., Ltd., third impression of second edition, P345-346.

To achieve the aforementioned needs, a technique is disclosed to form interconnections for the semiconductor devices described above using copper (Cu) as an interconnection body. Copper has a lower resistivity compared to aluminum (Al) or an aluminum alloy, such as aluminum copper silicon (AlCuSi) alloy, and is superior in electro-migration EM resistance (refer to patent document 1 above and patent documents 2-6 below). For example, a technique is disclosed to form a damascene type interconnection structure having an interconnection body made of copper formed on an insulating layer containing silicon, such as $SiO_2$, through a diffusion barrier layer, thereby preventing copper from diffusing into the insulating layer (refer to patent documents 7 and 8 below).

[Patent document 2] Japanese unexamined patent application publication no. S63-156341

[Patent document 3] Japanese unexamined patent application publication no. H01-202841

[Patent document 4] Japanese unexamined patent application publication no. H05-047760

[Patent document 5] Japanese unexamined patent application publication no. H06-140398

[Patent document 6] Japanese unexamined patent application publication no. H06-310509

[Patent document 7] Japanese unexamined patent application publication no. H11-054458

[Patent document 8] Japanese unexamined patent application publication no. H11-087349

In the above mentioned copper interconnection, the diffusion barrier layer has conventionally been made from manganese (Mn) (refer to patent document 5 above and patent documents 9 and 10 below), or boride or nitride of manganese (Mn) (refer to patent document 5 above), tantalum (Ta) (refer to patent document 2 above), chromium (Cr) (refer to patent documents 2 and 3 above), titanium (Ti) (refer to patent document 3 above), titanium nitride (TiN) (refer to patent documents 1 and 2 above), tungsten (W) (refer to patent document 2 above), molybdenum (Mo) (refer to patent document 2 above), zirconium (Zr) (refer to patent document 3), vanadium (V) (refer to patent document 3 above), niobium (Nb) (refer to patent document 3 above), nitride film of Zr, Ti, V, Ta, Nb, Cr, or boron compound film (refer to patent document 3 above), and the like.

Also, a technique for forming a diffusion barrier layer from a multilayer structure has been disclosed (refer to patent document 6 above). The technique disclosed in the patent document 6 prevents copper from diffusing into the $SiO_2$ insulating layer by providing a "trap layer" made of manganese (Mn) or magnesium (Mg) around the diffusion barrier layer, or as a base of the diffusion barrier layer which is made from tantalum (Ta), tungsten (W), or tantalum.tungsten (Ta—W) alloy.

Copper constituting the interconnection body is formed on the barrier layer by an electrolytic plating method, sputtering method (refer to patent documents 9 and 10 below), or plasma CVD (chemical vapor deposition) method (refer to patent document 11 below). As an example, a copper layer for an interconnection made of (111), (200), and (311) crystal faces is formed on a niobium (Nb) layer (refer to patent document 11 above). In order to uniformly form a copper interconnection body over a barrier layer, another technique is also disclosed where the copper interconnection body is formed through a seed layer, which is formed from a thin layer of copper (refer to patent document 12 below). For example, the copper layer of an interconnection formed by the electrolytic plating method over a thin layer of copper, which in turn is formed on a tantalum nitride (TaN) layer by a sputtering method, does not constitute a surface with uniform crystal face indexes. Instead, the surface is constituted from crystal faces with different indexes, such as (111), (200), and (311) crystal faces (refer to patent document 10).

[Patent document 9] Japanese unexamined patent application publication no. 2005-277390

[Patent document 10] Japanese unexamined patent application publication no. 2003-142487

[Patent document 11] Japanese unexamined patent application publication no. H05-190548

[Patent document 12] Japanese unexamined patent application publication no. 2006-049641

In recent years, another technique has been disclosed in that, rather than forming separately a barrier layer from tantalum or tantalum nitride and a copper seed layer over the barrier layer for forming the copper interconnection body, forming both of the above layers in a self forming manner (refer to patent document 9 above and patent document 13 below). For example, a technique has been known to form a diffusion barrier layer, in which its surface layer is a layer mainly composed of copper. The diffusion barrier layer is formed from a copper alloy layer with an alloying metal element and is formed on an insulating layer containing silicon (refer to patent documents 9 above, and patent document 13 below).

[Patent document 13] Japanese patent no. 4065959

According to the above mentioned technique, the copper interconnection body may easily be structured using the layer mainly composed of copper formed on the surface portion of the diffusion barrier layer. In this technique, the layer mainly composed of copper is used as a copper seed layer for forming the diffusion barrier layer in a self forming manner. Examples of the metal alloying element in the copper alloy layer may include manganese (Mn), niobium (Nb), zirconium (Zr), chromium (Cr), vanadium (V), yttrium (Y), rhenium (Re) and the like (refer to patent document 9 above).

The metal element described above has a diffusion coefficient greater than the self diffusion coefficient of copper and the metal element is oxidized more easily compared to copper (refer to patent document 13). In order to form a diffusion barrier layer in a self forming manner from a copper alloy layer or a solid solution layer containing the above mentioned metal elements as a material, it is common to conduct heat treatment on the copper alloy layer or the solid solution layer, after depositing these layers on an insulating layer (refer to patent documents 9 and 13 above).

An advantage of using the copper alloy or solid solution layers containing a metal element having a diffusion coefficient greater than the self diffusion coefficient of copper and being oxidized more easily compared to copper, is that the diffusion barrier layer, in which its surface layer is mainly composed of copper (copper seed layer), may be formed in a self forming manner by conducting the heat treatment. Meanwhile, however, there has been a problem in that the surface layer of the diffusion barrier layer, which is mainly composed of copper, is made from various crystallographic faces (crystal face) when the diffusion barrier layer is formed by heating the copper alloy layer or the solid solution layer containing such additive elements.

A concrete example of such a technical disadvantage resulted from the above mentioned problem is the possibility of providing a copper interconnection with a large amount of crystal grain boundaries on the surface layer of the diffusion barrier layer which is mainly composed of copper. When a large amount of crystal grain boundaries are present in the copper interconnection, the diffusion of copper constituting the interconnection body through the grain boundaries occurs significantly, thereby electro-migration (EM) resistance and stress-migration (SM) resistance are decreased. Further, the insulating property of the insulating layer is decreased for a damascene type copper interconnection structure. Therefore, the achievement of semiconductor devices with high operating reliability has not yet been met.

The present invention is made under the above-mentioned situation. The purpose of the present invention is to provide copper interconnection structures with low electrical resistance and with improved electro-migration (EM) and stress-migration (SM) resistance.

SUMMARY OF THE INVENTION

In accordance with one aspect of the present invention, a copper interconnection structure includes:
an insulating layer;
an interconnection body including copper in an opening provided on the insulating layer; and
a barrier layer, comprising a metal element and copper, formed between the insulating layer and the interconnection body, and wherein:

an atomic concentration of the metal element in the barrier layer is accumulated toward an outer surface of the barrier layer facing the insulating layer, and an atomic concentration of copper in the barrier layer is accumulated toward an inner surface of the barrier layer facing the interconnection body, and
the inner surface of the barrier layer comprises copper surface orientation of {111} and {200}, and an intensity of X-ray diffraction peak from the inner surface of the barrier layer is stronger for the {111} peak than for the {200} peak.

As described above, in the first aspect of the present invention the inner surface of the barrier layer comprises copper surface orientation of {111} and {200}. Further, the intensity of X-ray diffraction peak from the inner surface of the barrier layer is stronger for the {111} peak than for the {200} peak. Therefore, a crystal grain boundary having low surface energy is preferentially formed on the inner surface of the barrier layer, where the crystal grain boundary grows to a coarse grain. Accordingly, the density of crystal grain boundary, present in the copper interconnection body, is decreased such that copper interconnection structures with low electrical resistance and with improved electro-migration (EM) and stress-migration (SM) resistance are realized.

In accordance with a second aspect of the present invention, a copper interconnection structure includes:
an insulating layer including silicon;
an interconnection body including copper in an opening provided on the insulating layer; and
a barrier layer formed between the insulating layer and the interconnection body, wherein the barrier layer comprises:
a first barrier layer comprising a first metal element having an enthalpy of oxide formation lower than the enthalpy of oxide formation for silicon, wherein the first barrier layer is formed on an inner surface of the opening, and
a second barrier layer, comprising a second metal element and copper, formed on the first barrier layer, and wherein:
an atomic concentration of the second metal element in the second barrier layer is accumulated toward an outer surface of the second barrier layer facing the first barrier layer, and an atomic concentration of copper in the second barrier layer is accumulated toward an inner surface of the second barrier layer facing the interconnection body, and
the inner surface of the second barrier layer comprises copper surface orientation of {111} and {200}, and an intensity of X-ray diffraction peak from the inner surface of the barrier layer is stronger for the {111} peak than for the {200} peak.

According to the second aspect of the present invention, as described above, the first barrier layer comprising the first metal element having an enthalpy of oxide formation lower than the enthalpy of oxide formation for silicon, wherein the first barrier layer is formed on an inner surface of the opening. Accordingly, the intrusion of composing elements of the insulating layer, by passing through the barrier layer, into the interconnection body is prevented such that the copper interconnection body having a low electrical resistance is ensured.

Further, the inner surface of the second barrier layer comprises copper surface orientation of {111} and {200} where the intensity of X-ray diffraction peak from the inner surface of the barrier layer is stronger for the {111} peak than for the {200} peak. Therefore, a crystal grain boundary having low boundary energy is preferentially formed, on the inner surface of the barrier layer, where the crystal grain boundary grows to a coarse grain. Accordingly, the density of crystal grain boundary, present in the copper interconnection body, is decreased such that copper interconnection structures with low electrical resistance and with improved electro-migration (EM) and stress-migration (SM) resistance are realized.

In accordance with a third aspect of the present invention, a copper interconnection structure includes:
an insulating layer including silicon;
an interconnection body including copper, having an interconnection width in an opening provided on the insulating layer; and
a barrier layer formed between the insulating layer and the interconnection body, wherein the barrier layer comprises:
a first barrier layer comprising a first metal element having an enthalpy of oxide formation lower than the enthalpy of oxide formation for silicon, wherein the first barrier layer is formed on an inner surface of the opening, and
a second barrier layer, comprising a second metal element and copper, formed on the first barrier layer, and wherein:
an atomic concentration of the second metal element in the second barrier layer is accumulated toward an outer surface of the second barrier layer facing the first barrier layer, and an atomic concentration of copper in the second barrier layer is accumulated toward an inner surface of the second barrier layer facing the interconnection body, and
a total thickness of said first and second barrier layers is set to be not more than 12% of the interconnection width.

As described above, in the third aspect of the present invention the first barrier layer comprising the first metal element having an enthalpy of oxide formation lower than the enthalpy of oxide formation for silicon, wherein the first barrier layer is formed on an inner surface of the opening. Accordingly, the intrusion of composing elements of the insulating layer, by passing through the barrier layer, into the interconnection body is prevented such that the copper interconnection body having a low electrical resistance is ensured.

DETAILED DESCRIPTION OF THE INVENTION

Figure 1:
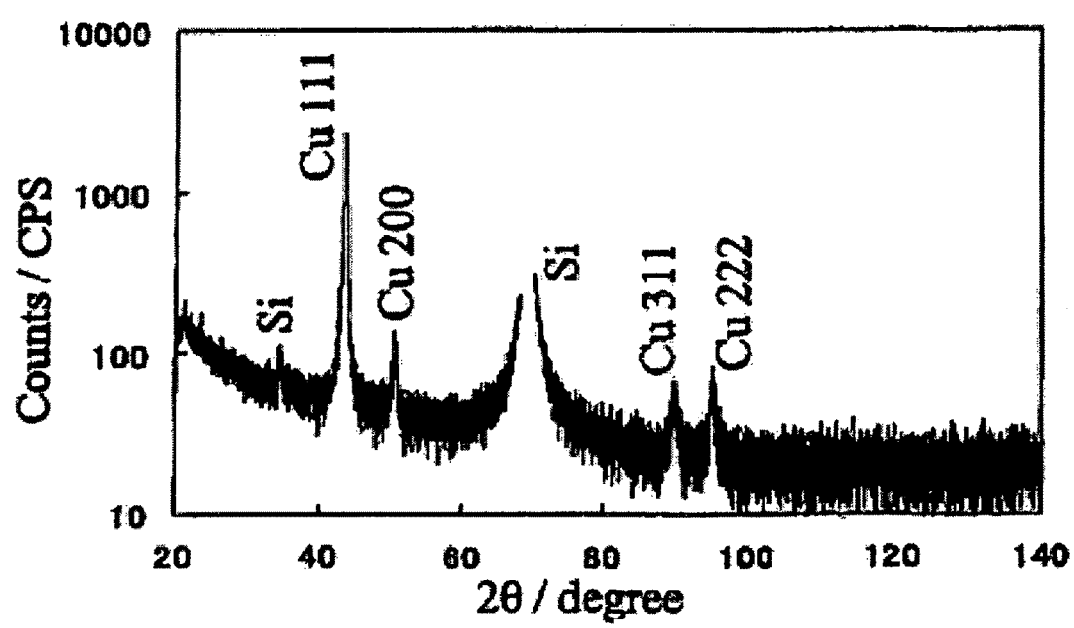
FIG. 1 illustrates an X-ray diffraction pattern taken from the surface of a copper layer deposited on a magnesium layer, before applying a heat treatment.

Embodiments of the present invention will be described hereinafter with reference to the accompanying drawings, in which the preferred exemplary embodiments of the invention are shown. The ensuing description is not intended to limit the scope, applicability or configuration of the disclosure. Rather, the ensuing description of the preferred exemplary embodiments will provide those skilled in the art with an enabling description for implementing the preferred exemplary embodiments of the disclosure. It should be noted that this invention may be embodied in different forms without departing from the spirit and scope of the invention as set forth in the appended claims.

Embodiments of the present invention relates in general to copper interconnections and their manufacturing process. More specifically, it relates to a new generation of copper interconnections with improved electro-migration (EM) and stress-migration resistance.

Embodiments of the present invention are directed to methods for forming copper interconnection structures and semiconductor devices capable of enhancing the EM or SM resistance and improving their operating reliability. This is achieved by reducing the kinds of copper surface orientation on a diffusion barrier layer when the diffusion barrier layer is formed. The diffusion barrier layer pertaining to the present invention is formed by applying a heat treatment to a copper alloy layer which contains a metal element. The metal element is easily oxidized compared to copper and features a diffusion coefficient greater than the self diffusion coefficient of copper. By reducing the kinds of copper surface orientations of the barrier layer, the density of crystal grain boundaries present in the copper interconnection body, as well as the electrical resistance of the copper interconnection, will be reduced.

In order to achieve a copper interconnection body with a low density of crystal grain boundaries, the challenge lies in providing a technique in which the surface portion of the barrier layer, which is mainly composed of copper, is formed from a limited number of copper surface orientations. In order to resolve this technical issue, the inventors of the present invention devoted themselves to study every possible factor that may affect the kinds of copper surface orientation of the barrier layer.

As a result, the inventors of the present invention have reached the following conclusion: The number of copper surface orientations, in a layer mainly composed of copper, depends on the type of metal element added into the copper alloy layer as an additive element. Although, most of metal elements are easily oxidized compared to copper, only a limited number of metal elements are capable of providing a reduced number of copper surface orientation in the copper seed layer.

The limited number of metal elements, referred hereinafter as the "metal element", exerts the action of reducing the kinds of copper surface orientation of the copper alloy layer when the copper alloy layer is exposed to a heat treatment, thereby providing a lower number of copper surface orientations, over the barrier layer, after applying the heat treatment. The number of copper surface orientations is lower compared to the time when the copper alloy layer is formed (at deposition) before applying the heat treatment. For example, in the case where a copper alloy layer with three kinds of copper crystal faces is formed at deposition, the appropriate metal element, added as an alloying element of the copper alloy layer, may reduce the kinds of copper crystal faces to two after applying the heat treatment.

A diffusion barrier layer, in which its surface layer is a layer mainly composed of copper, pertaining to the present invention, is provided on an insulating layer containing low permittivity silicon oxide which forms an interlayer insulating layer of a damascene type interconnection structure. Examples of the insulating layer with low permittivity silicon oxide may include silicon oxide carbide (SiOC: k~2.8), silicon fluoride oxide (SiOF: k~3.6), silicon fluoride carbide (SiCF: k~2.0-2.4), and silicon dioxide (SiO2: k~3.9). Organic low permittivity insulator such as poly-arelene ether (k~2.6) and polyimide (k~2.7-2.9) can also be used. Further, in other embodiments, the diffusion barrier layer may be provided on a surface of an insulating substrate containing silicate glass or quartz glass for forming gate electrodes with Schottky contact, or source and drain electrodes with ohmic contact in TFT-LCD devices.

In this embodiment, the insulating layer may be configured from a single insulating layer, such as SiOC. Alternatively, other embodiments may use multilayer structure, such as a silicon nitride (SiN) layer stacked over a silicon oxide carbide (SiOC) layer. Insulating layers with multilayer structure are advantageous in that the diffusion barrier layer, which is an oxide layer, may effectively be formed on the top surface of the multilayer structure containing oxygen. For example, a diffusion barrier layer may effectively be formed over an insulating layer with multilayer structure made from a porous silicon oxide carbide (SiOC) layer, as its first layer, having a plurality of pores with an average pore diameter of about a few nanometers, e.g. 2 nm, and a top layer (second layer), such as a dense SiOC, disposed over the porous SiOC layer.

The diffusion barrier layer pertaining to the preferred embodiments of the present invention is a layer where its surface portion is mainly composed of copper. The diffusion barrier layer of the preferred embodiments may be formed from a copper alloy layer containing a metal element, where the metal element can be oxidized easily compared to copper. Incidentally, an oxide forming enthalpy of copper is −167.5 kJ/mol at a temperature of 293K. (see Smithells Metals Reference Book, Seventh Edition, 8-25, Butterworth-Heinemann (1992)). The metal element which is oxidized more easily than copper is a metal element with an enthalpy of oxide formation lower than the enthalpy of oxide formation for copper at the temperature of 293K. Further, in this embodiment, the copper alloy layer is a layer composed of a solid solution alloy type copper, such as a substitutional type, in major proportions. Moreover, the copper alloy layer pertaining to the preferred embodiments of the present invention may include a copper layer, a copper-alloy layer including copper in major proportions, and a multilayer structure including the copper layer or the copper alloy layer and a layer made of the metal element where the metal element is oxidized more easily compared to copper.

In Particular, the copper alloy layer used favorably as a material for forming the diffusion barrier layer of the present invention is a layer including a metal element as an additive element which can be easily oxidized compared to copper. Among various metal elements, those with an effect of decreasing the type of surface crystal orientation (crystal faces constituting the surface of the copper alloy layer) after applying a heat treatment to the copper alloy layer are the most favorable. Without using the copper alloy layer including the metal element, it may be possible to determine whether the metal element is able to exert such an action of reducing the type of surface crystal orientation if used in the copper alloy layer as an additive element. This may be performed by forming a layered structure, in which a layer made of the metal element is first disposed on the insulating layer. Then, a copper layer is deposited over the first layer and the type of surface crystal orientation of copper (at deposition) is observed. By applying a heat treatment to the layered structure and examining the surface crystal orientation of copper after the heat treatment it would be possible to determine whether the type of surface crystal orientation of copper is reduced after the heat treatment.

Different methods may be used to determine the type of surface crystal orientation of copper. Examples of these methods may include an X-ray diffraction (XRD) method, a transmission electron diffraction (TED) method, or a reflection high energy electron diffraction (RHEED) method. The surface crystal orientation referred in the present disclosure exhibits an x-ray diffraction pattern having peaks at diffraction angles ($2\theta$) ranging from 20° to 140°. In the diffraction methods described above, e.g. the XRD method, there may be some cases where the x-ray diffraction pattern does not exhibit peaks even though the crystal faces constituting the actual surface. This is mainly due to the arrangement of atoms within the crystal and their structural factor ("Crystal Electron Microscopy", by Hiroyasu Saka, Nov. 15, 1997, Uchida Roukakuho Publishing Co. Ltd., First print, Page 75-81). In the present disclosure, the crystal faces generating the diffraction peaks, are at least "contained" in the surface crystal orientation differing from the case where the crystal faces are not limited to those generating the diffraction peaks.

Figure 2:
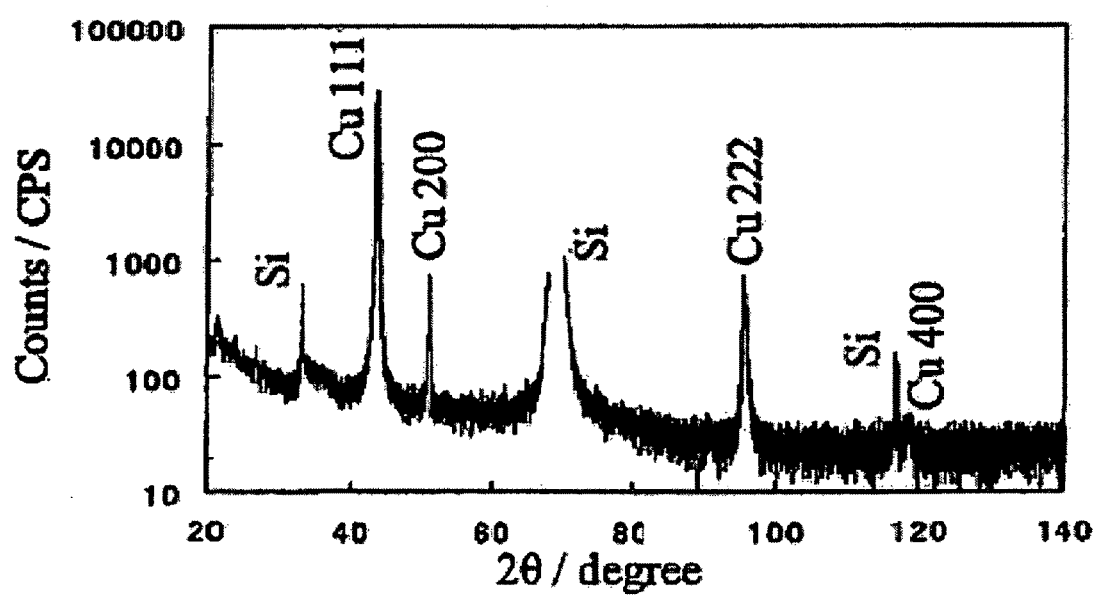
FIG. 2 illustrates an X-ray diffraction pattern taken from the surface of a copper layer deposited on a magnesium layer, after applying a heat treatment.

As an example, a multilayer structure including a magnesium (Mg) layer with a thickness of about 20 nm and a copper (Cu) layer with a thickness of about 150 nm will be explained. The Mg layer and the Cu layer are formed by a high-frequency sputtering method using magnesium of purity (99.9% (=3N)), formed on a $SiO_2$ layer as an insulating body on a {001}-Si substrate, and using high purity copper of 6N as a target. FIG. 1 illustrates an X-ray diffraction pattern taken from the surface of the copper layer of the multilayer structure after deposition. As shown in this figure, the XRD pattern illustrates diffraction peaks at the diffraction angles representing the copper crystal faces of {311}, {111}, and {200}. Namely, it is shown that the surface of the copper layer is configured from at least three kinds of crystal faces: {311}, {111}, and {001}. Meanwhile, FIG. 2 shows an XRD pattern after heat treating the deposited multilayer structure for 30 minutes at 347° C. (620K). As shown in this figure, the XRD pattern illustrates diffraction peaks at the diffraction angles representing the copper crystal faces of {111} and {200}. That is, the kinds of surface crystal orientation of copper layer is decreased to two: {111} and {001}, after heat treating the multilayer structure. Accordingly, it is determined that magnesium (Mg) is a metal element that reduces the types of crystal face orientation of copper after the heat treatment.

In addition to magnesium (Mg) described above, other metal elements such as manganese (Mn), aluminum (Al) and the like may also perform the action of reducing the kinds of surface crystal orientation of copper from three kinds at deposition to two kinds by the heat treatment. Similar to the case of magnesium (Mg), the surface crystal orientation of copper may decrease from three kinds at deposition, {311}, {111} and {001}, to two kinds, {111} and {001}, after heat treating the multilayer structure when the multilayer structure includes a manganese (Mn) or aluminum (Al) layer with a thickness of about 20 nm and a copper layer with a thickness of about 150 nm formed on the $SiO_2$ layer, as the insulating body, on the {001}-Si substrate.

Figure 3:
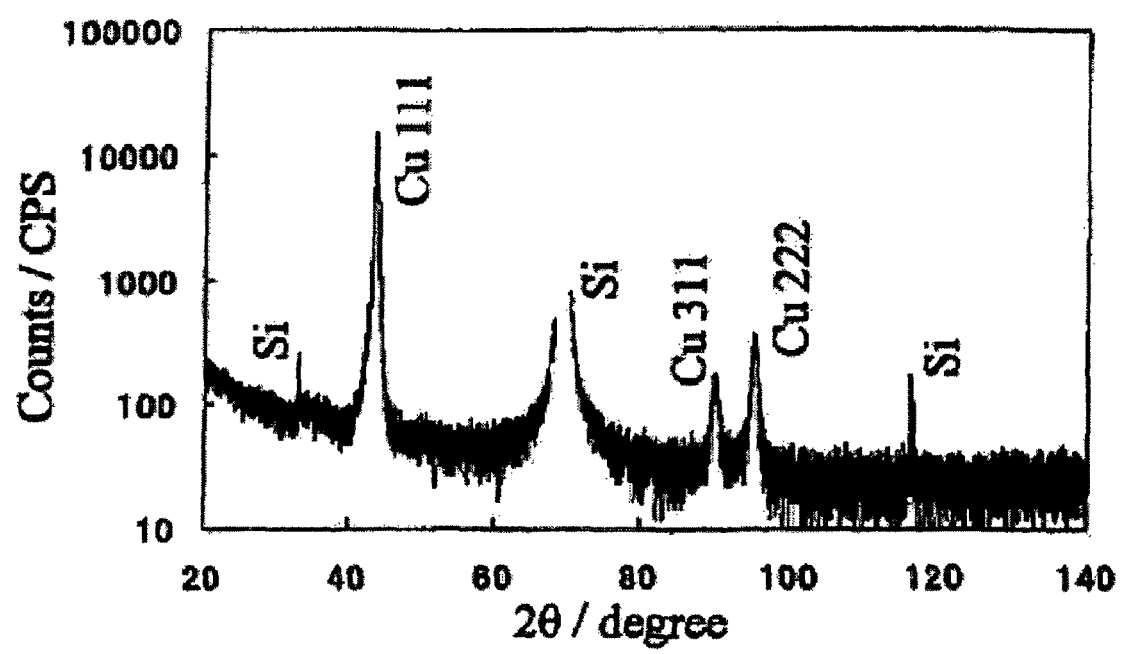
FIG. 3 illustrates an X-ray diffraction pattern taken from the surface of a copper layer deposited on a germanium layer before applying a heat treatment.
Figure 4:
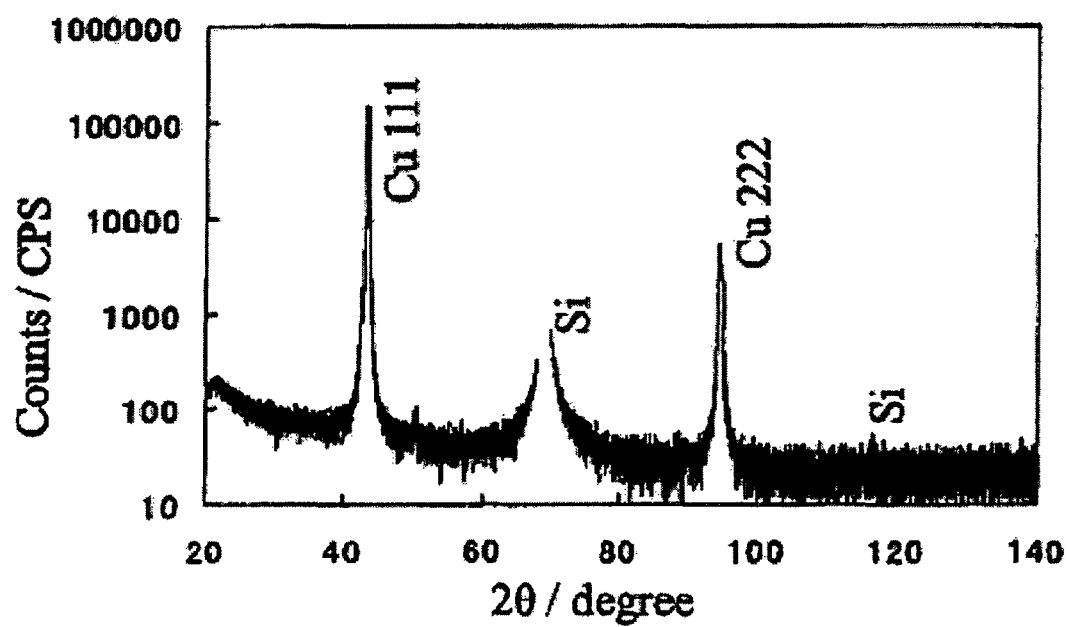
FIG. 4 illustrates an X-ray diffraction pattern taken from the surface of a copper layer deposited on a germanium layer after applying a heat treatment.

In what follows another example will be described in which a multilayer structure including a germanium layer (with thickness of about 20 nm) and a copper layer (thickness of about 150 nm) are formed by the high-frequency sputtering method using high purity germanium, formed on the $SiO_2$ film as an insulating body on the {001}-Si substrate, and using high purity copper of 6N as a target. FIG. 3 illustrates an XRD pattern taken from the surface of the copper layer of the multilayer structure after deposition. As shown in this figure, the XRD pattern illustrates diffraction peaks at the diffraction angles representing the copper crystal faces of {111} and {001}. Namely, it is shown that the surface of the copper layer is configured from two kinds of crystal faces: {111} and {001}. Meanwhile, FIG. 4 shows an XRD pattern after heat treating the deposited multilayer structure for 30 minutes at 337° C. (610K). As shown in this figure, the surface crystal orientation of copper layer is reduced down only to {111} crystal face. Based on the results, it is determined that germanium (Ge) is a metal element that reduces the kinds of crystal face orientation of the copper layer after the heat treatment.

Favorable heating conditions for decreasing the kinds of copper crystal face orientation is ranging from 327° C. (600K) to 427° C. (700K) in temperature and from one minute to 80 minutes in time. At lower temperatures, particularly lower than 327° C. (600K), for example at 77° C. (350K), the action of decreasing the type of surface crystal orientation of copper alloy layer may not be clearly determined. Meanwhile, higher temperatures, specifically those exceeding 427° C. (700K), are not preferable because the high temperature causes copper contained in the copper alloy layer to diffuse and intrude significantly into the insulating body, thereby the insulating body decreases its electrical insulating property. On the other hand, the high temperature causes the elements contained in the insulating body, such as silicon, to diffuse and intrude significantly into the copper or copper alloy layer, thereby stable decrease of the kinds of surface crystal orientation is inhibited.

In sum, the favorable heating condition, to obtain a copper layer in which the kinds of surface crystal orientation is decreased compared to the time of deposition, may be performed at temperatures not less than 327° C. (600K) and not more than 327° C. (700K), in an inert gas atmosphere, and for a heating time of not less than one minute and not more than 80 minutes.

Referring back to FIG. 2, the heating condition described above is favorable for two purposes: 1) decreasing the surface crystal orientation of copper to {111} and {001} crystal faces and 2) obtaining a layer mainly composed of copper where the intensity of X-ray diffraction (XRD) peaks is stronger for the {111} crystal face than for the {002} crystal face. In this disclosure, "high" or "low" intensity refers to the number of X-ray counts per second on the X-ray diffraction pattern. It should be noted that although the kinds of surface crystal face orientation is reduced to two, if the surface of the layer mainly composed of copper is formed primarily from either type, it may contribute to the formation of a copper interconnection body with low density of crystal grain boundaries.

The material that favorably provides the diffusion barrier layer pertaining to the present invention is a copper alloy layer containing any one or not less than two metal elements such as magnesium (Mg) ($\Delta H^{293}=-601.6$ KJ/mol), manganese (Mn) ($\Delta^{293}=-1387.5$ KJ/mol), germanium (Ge) ($\Delta^{293}=-580.2$ KJ/mol) or aluminum (Al) ($\Delta^{293}=-240.7$ KJ/mol). These metal elements are among those that are easily oxidized compared to copper. The copper alloy layer may include a layer composed of a solid solution such as a substitutional type. By way of example, the copper alloy layer may include Cu—Mg, Cu—Mn, Cu—Ge, or Cu—Al. Further, the copper alloy may include a multilayer structure with a copper layer and a magnesium layer or a copper layer and manganese layer.

In particular, the copper alloy layer containing manganese (with a diffusion coefficient of about $1.97 \times 10^{-20}$ cm$^2$/s at 400° C.) or germanium (with a diffusion coefficient of about $1.13X \times 10^{-19}$ cm$^2$/s at 400° C.) may favorably be used to form a diffusion barrier layer in which the surface layer section is a layer mainly composed of copper. It should be noted that both manganese and germanium have a diffusion coefficient larger than the self diffusion coefficient of copper ($5.51 \times 10^{-21}$ cm$^2$/s at 400° C.) [Landolt-Bornstein, New Series Group III, Vol. 263, 2, 11, Springer Verlag, Berlin (1990)]. By using the copper alloy layer including manganese or germanium as alloying materials, for example, an oxide layer which constitutes a diffusion barrier layer may be formed in a self forming manner on the insulating layer containing oxygen, as well as the layer mainly composed of copper may be formed in a self forming manner on the surface portion of the diffusion barrier layer. This is mainly due to the fact that these metal elements are more easily oxidized compared to copper and also have diffusion coefficients greater than the self diffusion coefficient of copper.

For example, in the case where the diffusion barrier layer is first formed by depositing a copper layer containing manganese as an additive element over an insulating layer made of silicon oxide and then by heat treating the copper layer, the diffusion barrier layer will be made from an oxide layer including manganese, copper and the composing elements of the insulating body. For example, the oxide layer may be shown by the following composition formula: $Mn_xSi_yCu_zO$ ($0<X, Y, Z<1, X+Y+Z=1$, generally, $X>Y, Z$). Further, the diffusion barrier layer which is an oxide layer with the above composition formula may be formed by heat treating a multilayer structure as the material for forming the barrier layer. The multilayer structure may include a copper layer deposited over a manganese layer, formed on an insulating body made of silicon oxide. In addition, the diffusion barrier layer which is an oxide layer with the above composition formula can also be formed by changing the order of deposition in the multilayer structure.

The copper alloy layer used for forming the diffusion barrier layer pertaining to the present invention may be formed by a high-frequency sputtering method using an alloy material of copper and manganese (Cu—Mn) as target, which contains manganese in a concentration range of not less than 5 atom % and not more than 10 atom %. Alternatively, the copper alloy layer may be formed using copper manganese alloy, high-purity manganese, or high purity copper by a chemical vapor deposition (CVD) method, a high-frequency sputtering method, an ion plating method, a laser ablation method, an electrolytic plating method and the like. Furthermore, other embodiments may use germanium (Ge) as an alloying material for forming the copper alloy layer using the above mentioned deposition procedures, such as a high-frequency sputtering method, a CVD method, an ion plating method, a laser ablation method, and the like. For example, the copper germanium (Cu—Ge) alloy, used in the above exemplary embodiments, contains germanium in a concentration range of not less than 1.0 atom % and not more than 7.0 atom %, for example, in atomic concentration, high-purity germanium, or high purity copper.

In a damascene type interconnection structure, the narrower the interconnection width, provided on an interconnection groove, such as trench groove or via hole of the insulating layer, the thinner is the thickness of the copper alloy layer, which is used as a material for forming the diffusion barrier layer. For example, in a case where the interconnection width is about 90 nm, the suitable thickness of the diffusion barrier layer for this interconnection width is about 10+/−2 nm. Further, in a case where the interconnection width is about 65 nm, the suitable thickness of the diffusion barrier layer is about 7 nm. Furthermore, in a case where the interconnection width is about 32 nm, the suitable thickness of the diffusion barrier layer is about 3.5 nm. Moreover, in a case where the interconnection width is about 22 nm, the thickness of the diffusion barrier layer which is suitable for this interconnection width is about 2.5 nm. It is preferable that the thickness of the diffusion barrier layer is set to be not less than 0.5 nm regardless of the interconnection width. It is more preferable that the thickness of the diffusion barrier layer is set to be not less than 1 nm.

When the diffusion barrier layer is made of an ultrathin layer with a thickness of about 0.5 to 1 nm, oxygen (O) and silicon (Si), which are the composing elements of the insulting layer, pass through the diffusion barrier layer and intrude into the copper interconnection body provided on the barrier layer. This results in an inconvenience in that the copper interconnection body featuring a low electric resistivity and high conductivity can not be obtained. Such an inconvenience may be overcome by providing the diffusion barrier layer pertaining to the present invention, in which its surface layer is the layer mainly composed of copper, on a layer containing a metal element which is oxidized more easily than silicon (Si).

Enthalpy of oxide formation at 293K ($\Delta H^{293}$) for silicon is −910.9 KJ/mol. In comparison, a metal element which is oxidized more easily than silicon is a metal element with an enthalpy of oxide formation lower than silicon. Example of those metal elements may include aluminum (Al), ($\Delta H^{293}$=−1678.2 KJ/mol), scandium (Sc) ($\Delta H^{293}$=−1906.7 KJ/mol), titanium (Ti) ($\Delta H^{293}$=−2457.2 KJ/mol), vanadium (V) ($\Delta H^{293}$=−1551.3 KJ/mol), chromium (Cr) ($\Delta H^{293}$=−1130.4 KJ/mol), manganese (Mn) ($\Delta H^{293}$=−1387.5 KJ/mol), iron (Fe) ($\Delta H^{293}$=−1117.5 KJ/mol), yttrium (Y) ($\Delta H^{293}$=−1906.7 KJ/mol), zirconium (Zr) ($\Delta H^{293}$=−1101.3 KJ/mol), niobium (Nb) ($\Delta H^{293}$=−1900.8 KJ/mol), antimony (Sb) ($\Delta H^{293}$=−1008.0 KJ/mol), hafnium (Hf) ($\Delta H^{293}$=−1113.7 KJ/mol), tantalum (Ta) ($\Delta H^{293}$=−2047.3 KJ/mol), or rhenium (Re) ($\Delta H^{293}$=−1249.1 KJ/mol). All of the ($\Delta H^{293}$) values, described in this paragraph, are cited from Smithells Metals Reference Book, Seventh Edition, 8-25, Butterworth-Heinemann (1992).

In the case where a layer containing any one or more than one metal elements with the enthalpy of oxide formation energy lower than silicon, is positioned between the insulating layer and the diffusion barrier layer, oxygen atoms, which are the composing element of the insulating layer are captured by the metal element. Therefore, the effect of obtaining the copper interconnection body with low electric resistivity is exerted as the intrusion of oxygen into the copper interconnection body is prevented. In this embodiment, it is preferable that the percentage of the total thickness of both layers is set to be not more than about 12% of the interconnection width. For example, the total thickness of the diffusion barrier layer and the layer containing any one or more than one metal element with the enthalpy of oxide formation lower than silicon is about 5 nm for an interconnection width of about 45 nm.

It should be noted that, the layer containing the metal element with a significantly lower enthalpy of oxide formation compared to silicon, but not more than −1500 kJ/mol of $\Delta H^{293}$, may easily be oxidized. These metal elements, such as aluminum (Al), scandium (Sc), or vanadium (V), may structure a layer that can surely prevent the amount of oxygen intruding into the copper interconnection body by passing through the diffusion barrier layer of the present invention. This is mainly due to the ease of oxidation of these metal elements that shows the ease of bonding with oxygen (O) atoms. Further, in other embodiments, the layer may include tantalum (Ta) or titanium (Ti) with the enthalpy of oxide formation not more than −2000 kJ/mol of $\Delta^{293}$. By using these metal elements, a layer capable of surely preventing the oxygen (O) from intruding into the copper interconnection body through the diffusion barrier layer of the present invention is formed. This is mainly due to the fact that these metal elements are significantly easy to be oxidized. The layer containing tantalum (Ta) or titanium (Ti) may be formed from a single layer titanium or tantalum or formed from tantalum nitride (TaN), titanium nitride (TiN) or the like.

The layer containing any one or more than two metal elements with the enthalpy of oxide formation lower than silicon is formed prior to forming the copper alloy layer on the insulating layer. For example, a tantalum or titanium layer may be formed by a high-frequency sputtering method using a high purity tantalum or titanium as the target material. Other embodiments may use a chemical vapor deposition (CVD) method using an organic tantalum compound and the like as a material. Further, in an alternative embodiment, a tantalum nitride or titanium nitride layer may also be formed by a high-frequency sputtering method, such as a reactive ion sputtering method. In yet another embodiment, the titanium nitride layer may also be formed by a chemical vapor deposition (CVD) method using a titanium compound, such as titanium tetrachloride (TiCl$_4$) as a material.

The diffusion barrier layer is formed by heating the copper alloy layer provided directly on the insulating layer or on the layer containing any one or more than two metal elements with the enthalpy of oxide formation energy lower than silicon. This heat treatment is conducted to diffuse and move the metal element, which is easily oxidized compared to copper, contained in the copper alloy layer or constitutes the alloy layer in a multilayer structure into the insulating layer side. This heat treatment is also conducted to form an oxide diffusion barrier layer, which is bond to the oxygen constituting the insulating layer, on the region that has an interface with the insulating layer. This heat treatment also conducted to provide the diffusion barrier layer in which its surface layer is mainly composed of copper with high electrical conductivity. In addition, this heat treatment rejects the metal element from copper and accumulates the metal element into the interface region with the insulating layer. Therefore, in the preferred embodiment, the copper alloy layer contains a metal element having the enthalpy of oxide formation lower than copper such that the barrier layer, which is made of an oxide layer, can be formed on the interface region with the insulating layer while a layer mainly composed of copper can be formed on the surface portion of the barrier layer.

Favorable temperatures for heating the copper alloy layer are ranging from 170° C. to 427° C. (450K-700K). In the case of low temperatures, below 170° C. (450K), the metal element contained in the copper alloy layer, which is oxidized more easily compared to copper, can not be diffused and moved sufficiently into the insulating layer, e.g. SiOC. Therefore, it is inconvenient in that the oxide layer with a sufficient thickness can not be stably formed to act as a barrier layer in the interface region with the insulating body. Meanwhile, in the case where the heat treatment is performed at high temperatures, exceeding 427° C. (700K), the thermal diffusion of metal element, e.g. germanium (Ge), to the surface layer side of the copper alloy layer occurs significantly. This results in forming the layer with a low electric conductivity which contains a large amount of germanium accumulating on the surface of the diffusion barrier layer. Consequently, this causes a problem in which the copper interconnection body is formed with a low electric resistivity.

The heat treatment of the copper alloy layer is preferably performed in an inert gas atmosphere. Examples of the inert gas atmospheres may include helium (He), neon (Ne), argon (Ar), krypton (Kr), xenon (Xe) and the like. Among these inert gas atmospheres, it is preferable to use He, Ne, or Ar for conducting the heat treatment. In addition, it is more preferable from a view point of economic efficiency to use Ar gas or He gas atmosphere for the heat treatment.

Furthermore, it is preferable to circulate the inert gas atmosphere, e.g. Ar or He, during the heat treatment of the copper alloy layer. This is mainly to sweep the volatile carbon hydride oxide generated from the insulating layer and also to exhaust the same product from the inert gas atmosphere of the heat treatment, thereby preventing the contamination of the diffusion barrier layer, for example. It is also preferable to increase the circulation amount of the inert gas atmosphere as the heat temperature is set to be higher within the preferable temperature range as described above. In the case where the heat treatment is performed at the temperature not less than 600K (327° C.) and not more than 700K (427° C.), the circulation volume of Ar gas is preferably set to about 0.1 to 5.0 liters per minute.

It should be noted that the same heat treatment procedure may be applied for reducing the kinds of surface crystal orientation of copper, positioned over the diffusion barrier layer, and for forming the diffusion barrier layer itself. For example, by applying the heat treatment at temperatures ranging from 600K to 700K (327° C.-427° C.), the diffusion barrier layer can be formed as well as the layer mainly composed of copper in which the kinds of surface crystal orientation is reduced compared to the time when the copper alloy layer is deposited before the heat treatment. In this common heat treatment procedure, it is preferable to keep the heating time to 80 minutes. This is mainly due to the fact that an excess diffusion of metal elements, such as manganese, occurs if the heating time exceeds 80 minutes for temperatures ranging from 600K to 700K (327° C.-427° C.). Thereby, the diffusion barrier layer featuring favorable barrier properties can not be stably formed.

After the heat treatment, copper which will form the interconnection body is deposited over the diffusion barrier layer using the layer mainly composed of copper as a copper seed layer. The copper interconnection body may be deposited using a chemical or a physical deposition method, such as an electro plating method, an ion plating method, or a CVD method. In order to form an interconnection body with low electric resistivity, the copper deposited over the diffusion barrier layer is preferably high purity copper containing less metal element with higher electrical resistivity compared to copper. As for the metal element with higher electrical resistivity compared to copper, it is possible to use copper with high degree of purity about 99.995%, in which the total contents of aluminum (Al) is not more than 50 weight parts per million (wt·ppm).

EMBODIMENT

Embodiment 1

In the following paragraphs, the contents of the first embodiment pertaining to the present invention will be fully explained with reference to FIGS. 5-10. By way of example, the copper interconnection structure of the present invention is provided with a diffusion barrier layer which is in turn formed from a copper alloy layer having a multilayer structure. The multilayer structure is made from the stacked layers of copper (Cu) and manganese (Mn).

Figure 5:
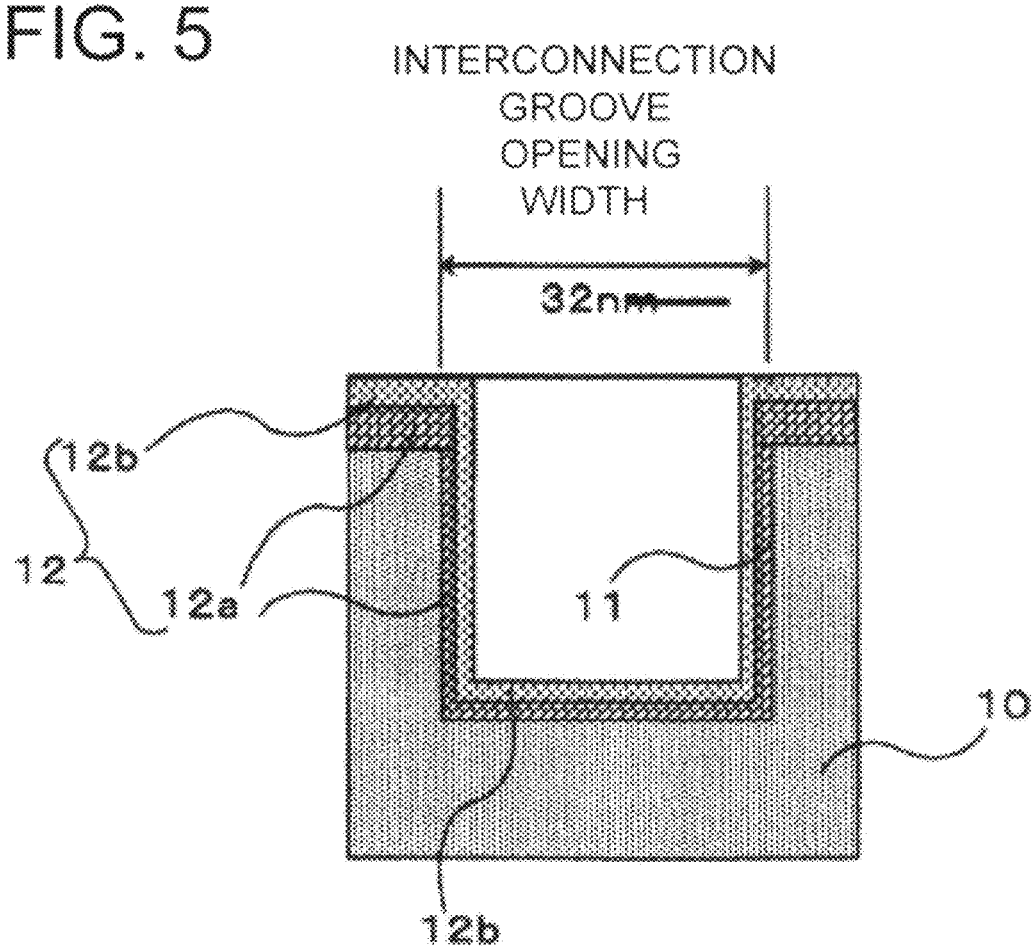
FIG. 5 illustrates schematically the first step of a process for manufacturing an embodiment of a copper interconnection structure.

With reference to FIG. 5, a schematic diagram of the first step of a process for manufacturing an embodiment of a copper interconnection with single damascene structure is shown.

As shown in this figure, a trench form interconnection groove (groove form opening) 11 is first formed in an insulating layer 10, e.g. $SiO_2$, with a thickness of 150 nm on a {001}-silicon (Si) substrate, which is not shown in this figure. The vertical width (opening width) of the interconnection grove 11 is set to about 32 nm. Then, a manganese layer 12*a* is deposited over an inner surface and an upper surface side of the interconnection groove 11 using high purity manganese (degree of purity=5N) as a target material by a common high-frequency sputtering method. The thickness of the manganese layer 12*a* is about 2 nm. Next, a copper layer 12*b* with a thickness of about 2 nm is stacked over the manganese layer 12*a* by the common high-frequency sputtering method using a high purity copper (degree of purity=6N) as a target material. In this way, the copper alloy layer 12 with a multilayer structure is formed. The multilayer structure is formed by the stacking layers of manganese 12*a* and copper 12*b* which are forming materials for the diffusion barrier layer. The environmental pressure for forming the manganese layer 12*a* and the copper layer 12*b* by the sputtering method is set to be about 0.6 Pascal (Pa).

Figure 6:
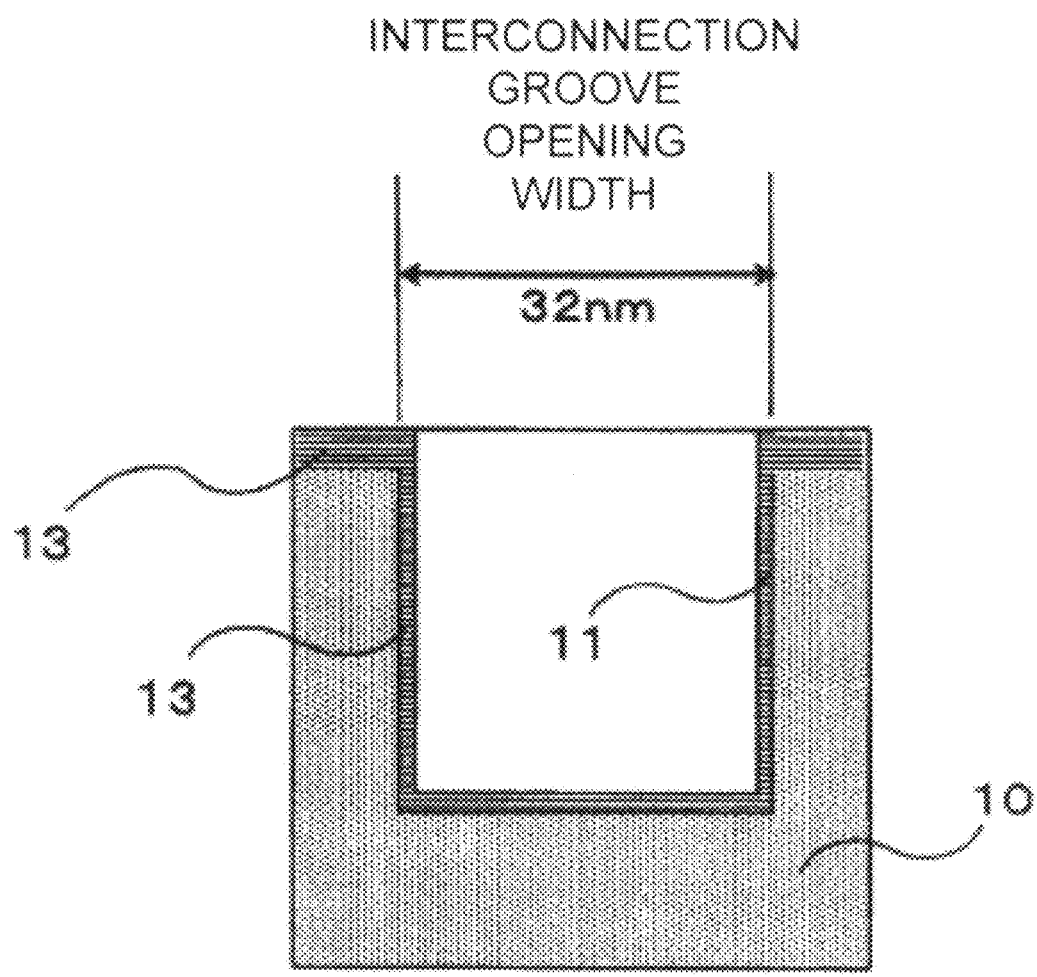
FIG. 6 illustrates schematically the second step of a process for manufacturing of an embodiment of a copper interconnection structure.

Next, the multilayer structure 12 is heated at 357° C. (630K) for 15 minutes in argon (Ar) gas flow, thereby forming the diffusion barrier layer 13. The flow rate of argon gas is set to be about 2.5 liter/minute. Referring next to FIG. 6, a schematic diagram of the second step of a process for manufacturing an embodiment of a copper interconnection with single damascene structure is shown. A cross-sectional view of the interconnection structure with the diffusion barrier layer 13 formed in a unit layer after heat treating the manganese layer 12*a* and the copper layer 12*b* is shown. A common Secondary Ion Mass Spectroscopy (SIMS) analysis shows that manganese is accumulated in a concentrated manner on the bottom portion of the diffusion barrier layer 13 at the interface with $SiO_2$ insulating layer 10. Further, the analysis also showed that the atomic concentration of copper is increased towards the surface portion of the diffusion barrier layer 13. Meanwhile, the atomic concentration of manganese is decreased towards the surface portion of the diffusion barrier layer 13 which corresponds to the increase of the atomic concentration of copper. Thus, the SIMS analysis shows that the surface layer portion of the diffusion barrier layer 13 is mainly composed of copper.

Further, an Electron Energy Loss Spectroscopy (EELS) method, which is different from the SIMS method, is used for analyzing the distribution of atomic concentration inside of the diffusion barrier layer 13. In this analysis, a field emission type transmission electron microscope with a high resolution is used and the element analysis is performed by scanning an electron beam at 0.2 nm interval. As a result, it is again confirmed that manganese is accumulated on the bottom portion of the diffusion barrier layer 13 at the interface with insulating layer. Additionally, it is also found that manganese is present mainly as a manganese oxide in the diffusion barrier layer 13. Further, the EELS analysis shows that a large amount of copper is present on the surface portion of the diffusion barrier layer 13. Thus, the EELS analysis also confirms that the surface portion of the diffusion barrier layer 13 is mainly composed of copper.

The surface crystal orientation of the copper alloy layer with the multilayer structure 12, as described above, is examined before and after the heat treatment process. For this examination, experimental samples are prepared separately in order to obtain clear X-ray diffraction patterns from their surface. These experimental samples have similar structures as those described above with regard to the first embodiment, and they feature multilayer structure where a manganese layer with a thickness of 20 nm and a copper layer with a thickness of 50 nm are stacked on a $SiO_2$ insulating layer, which is provided in series on a {001}-Si substrate. The same high-frequency sputtering method is used for forming the experimental sample with the same forming condition as described above in regard to FIG. 5.

Figure 7:
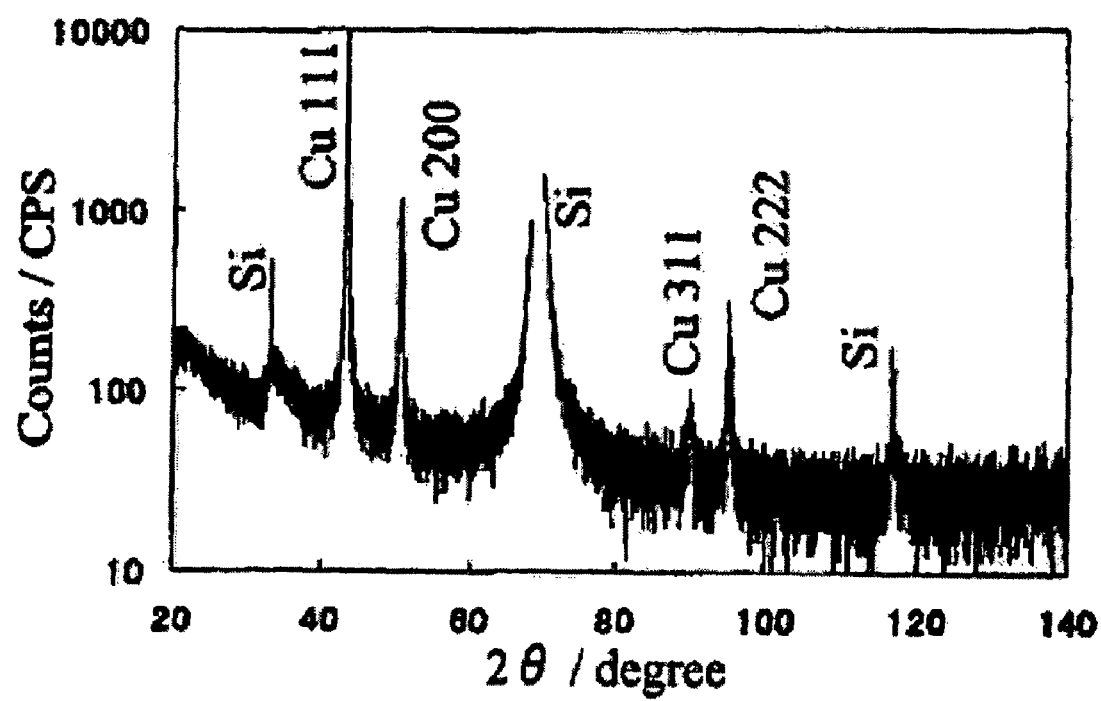
FIG. 7 illustrates an X-ray diffraction pattern taken from the surface of a multilayer copper-alloy structure before applying a heat treatment.
Figure 8:
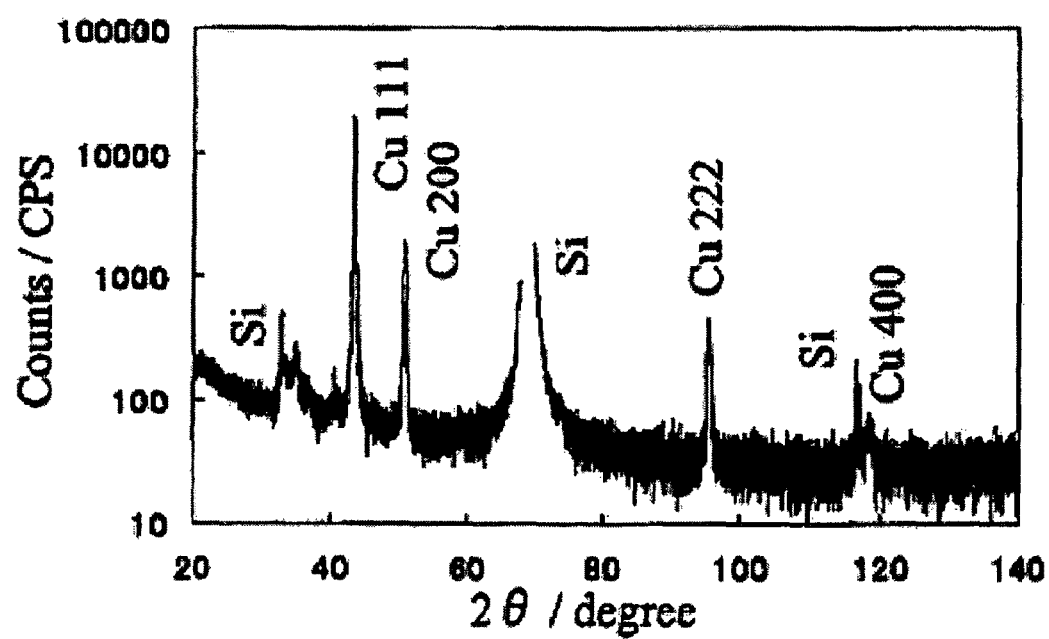
FIG. 8 illustrates an X-ray diffraction pattern taken from the surface of a multilayer copper-alloy structure, diffusion barrier layer, after applying a heat treatment.
Figure 9:
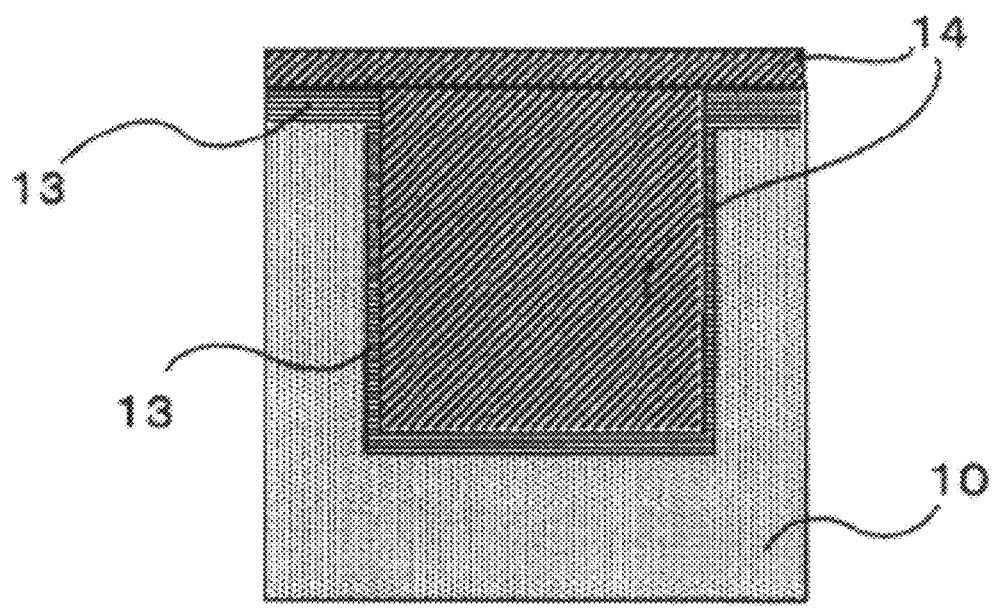
FIG. 9 illustrates schematically the third step of a process for manufacturing of an embodiment of a copper interconnection structure.

FIG. 7 illustrates an X-ray diffraction (XRD) pattern taken from the surface of the copper alloy layer 12 with a multilayer structure after deposition. As shown in this figure, the XRD pattern illustrates diffraction peaks at the diffraction angles representing the copper crystal faces of {311}, {002}, and {111}. That is, the copper surface of the experimental sample is configured from three kinds of crystal faces: {311}, {001} and {111}. Meanwhile, FIG. 8 shows an XRD pattern after heat treating the experimental sample under the same conditions as those described above in regard to the heat treating of multilayer structure 12. As shown in this figure, the XRD pattern illustrates diffraction peaks at the diffraction angles representing the copper crystal faces of {001} and {111}. That is, the kinds of surface crystal orientation of copper after heat treating the multilayer structure 12, under the same conditions as those described above in regard to the aforementioned heat treating, is decreased to two: {001} and {111}.

Figure 10:
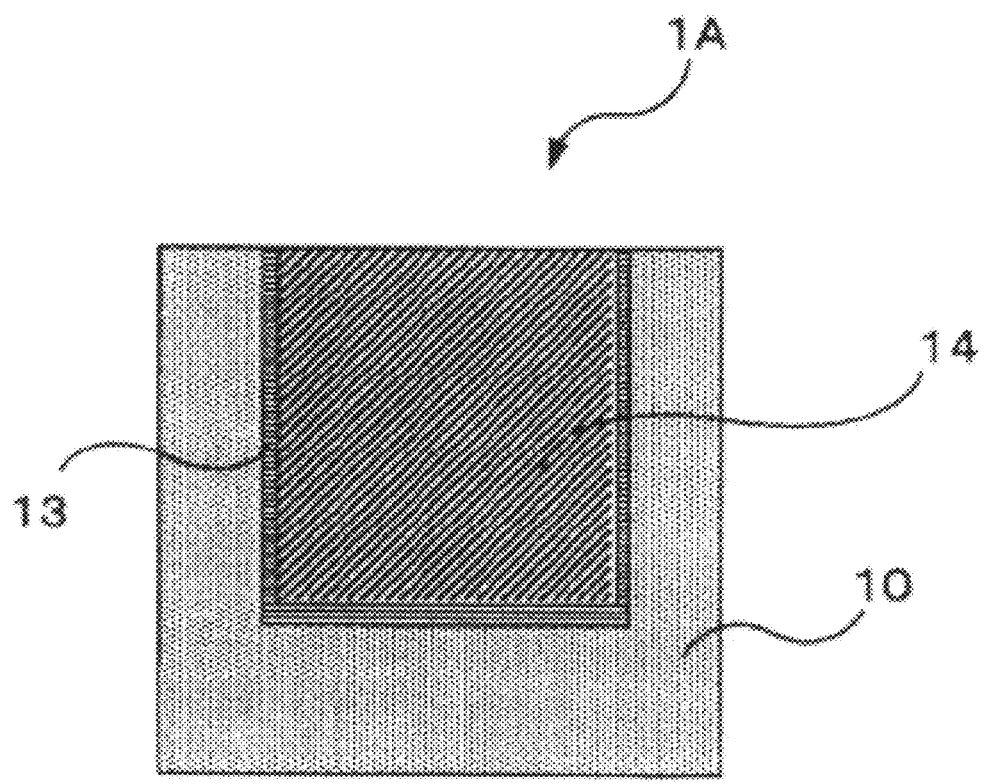
FIG. 10 illustrates a cross-sectional view of an embodiment of a copper interconnection structure, manufactured by the process steps shown in FIGS. 5, 6, and 9.

Since the surface layer portion of the diffusion barrier layer 13 is mainly composed of copper and its surface crystal orientations is configured in the {001} and {111} faces after the heat treatment, a buried copper is next deposited on the diffusion barrier layer 13 using the layer mainly composed of copper as a copper seed layer. As shown schematically in FIG. 9, the buried copper representing the interconnection body 14 is formed using an electrolytic plating method so as to fill inside of the interconnection groove 11. In the last step of manufacturing process, copper which is excessively formed on the interconnection groove 11 and the diffusion barrier layer 13 remained on the insulating layer 10 ($SiO_2$) are removed by a chemical and mechanical polishing (CMP) methods until they reach a level face identical to the upper surface of the insulating layer 10. In this way, a single damascene type copper interconnection structure 1A is completed as schematically shown in FIG. 10.

The internal structure of the copper interconnection body 14 is examined by a cross-sectional TEM method using a common high resolution transmission electron microscope (HR-TEM). As a result, the number of crystal grain boundaries contained in the copper interconnection body 14 is found to be about $5/\mu m^2$ in area density. The area density is the value obtained by dividing the number of crystal grain boundary which is counted in the area examined by the cross-section TEM method, by the area of the examined area.

Further, the electric resistivity (ρ) of the copper interconnection body 14 is measured by direct current four-probe method at room temperature. The electric resistivity (ρ) is calculated using the following formula:

$$P=(\pi/\ln 2)\cdot t\cdot (V/I)\cdot f1\cdot f2 \quad (1)$$

where t, I, and V represent respectively a thickness of the copper interconnection body 14, a current (50 mA) conducted into the copper interconnection body 14 from two probes facing each other at the time of measurement, and a voltage generated when the current I is conducted between the other two probes. In this formula, f1 and f2 represent form factors pertaining to the copper interconnection body 14 (refer to F. M. Smith, The Bell System Technical Journal, 37(1958), P. 711). The electric resistivity of the copper interconnection body 14 is calculated for the first embodiment and it turns out to be about 2.1 (μΩ·cm), which is close to the resistivity of pure bulk copper, 1.7 μΩ·cm (refer to Japanese unexamined patent application publication No. H1-202841).

The first embodiment of the present invention will be explained in terms of different materials and deposition order for the copper alloy layer 12 with a multilayer structure in two comparative examples.

Comparative Example 1

A trench form interconnection groove 11 with the same opening width (32 nm) is formed on the interlayer insulating layer 10 provided on the {001}-silicon (Si) substrate made of the same material ($SiO_2$) as described before. Thereafter, instead of the stacked layers of manganese (Mn) and copper (Cu), a tantalum nitride (TaN) layer is first deposited over the interlayer insulating layer 10 and then a tantalum layer is deposited over the TaN layer. In this embodiment, the thickness of each tantalum nitride and tantalum layers is set to be about 2 nm.

Next, this TaN/Ta double structure is heat treated under the same conditions (time period, temperature, and atmosphere) as those derived in the first embodiment described above. After the heat treatment process, a single damascene type copper interconnection structure is completed by burying copper into the interconnection groove 11 using the electrolytic plating method as described above in the first embodiment.

The internal structure of the copper interconnection body 14 is examined using the cross-sectional TEM method. The number of crystal grain boundary contained in the copper interconnection body 14 is about $14/\mu m^2$ in area density. In this embodiment, the area density of the crystal grain boundary is higher by about 1 digit compared to the case where the copper interconnection body 14 is formed over the diffusion barrier layer 13, which is made from the stacked layers of manganese and copper. Because the interconnection body 14 is formed from the copper containing the crystal grain boundaries in high density, the electric resistivity of the copper interconnection body 14, identically measured using the direct current four-probe method, is about 4.5 μΩ·cm at room temperature, which is about twice as large as that in the case of first embodiment.

To understand the resulting effect of higher amount of crystal grain boundaries in the copper interconnection body 14, experimental samples having similar structure as those described in the above structure are examined. The experimental samples used in our analysis feature a multilayer structure with the stacking layers of tantalum (thickness of about 20 nm) and copper (thickness of about 150 nm) on the $SiO_2$ insulating layer provided in series on the {001}-Si substrate.

Figure 11:
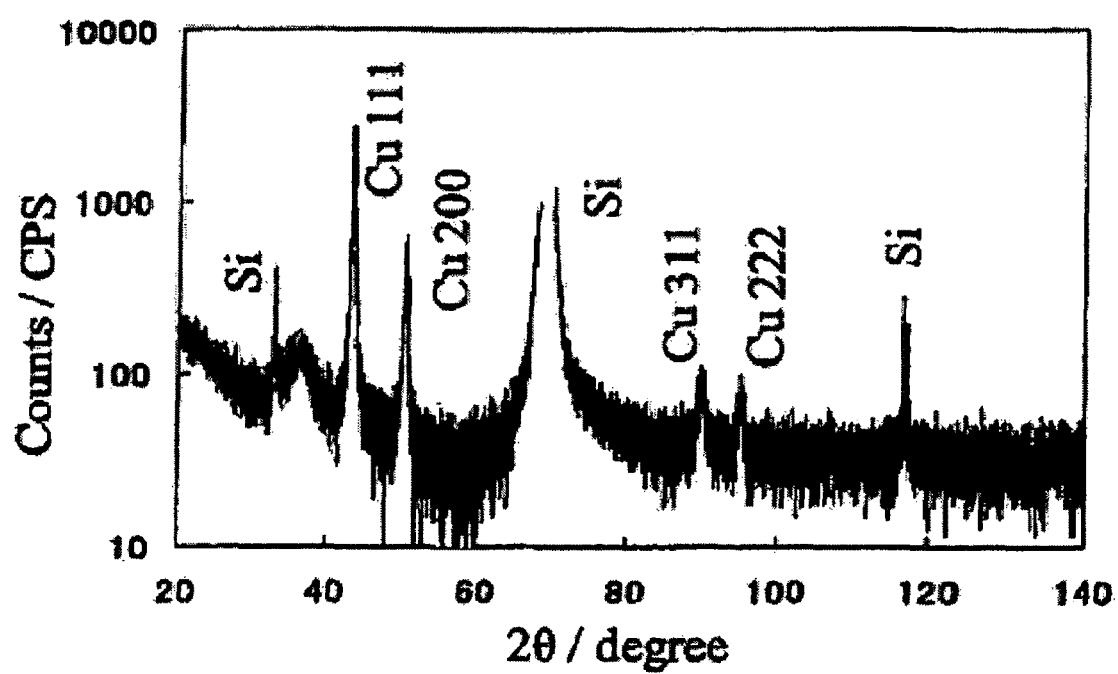
FIG. 11 is an X-ray diffraction pattern taken from the surface of a copper layer deposited on a tantalum layer before applying a heat treatment.
Figure 12:
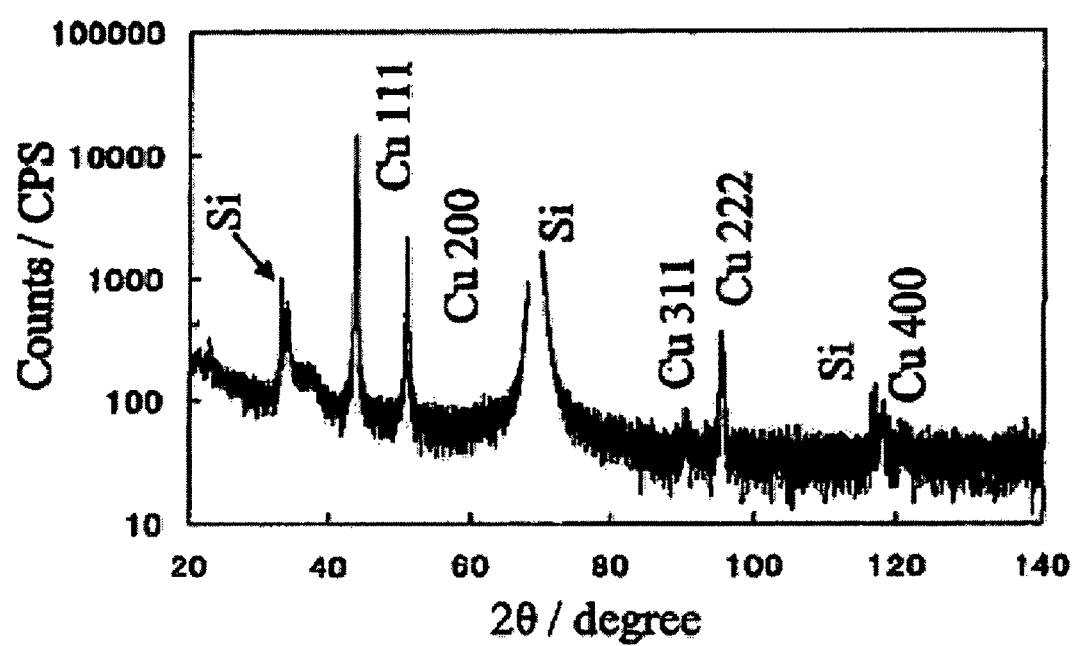
FIG. 12 is an X-ray diffraction pattern taken from the surface of a copper layer deposited on a tantalum layer after applying a heat treatment.

FIG. 11 illustrates an XRD diffraction pattern taken from the surface of the copper layer of the experimental samples at the time of deposition. As shown in this figure, the XRD pattern illustrates diffraction peaks at the diffraction angles representing the copper crystal faces of {311}, {111}, and {001}. Further, FIG. 12 illustrates an XRD pattern after the experimental samples undergoes a heat treatment process under the same conditions as those described in the first embodiment. As shown in FIG. 12, the XRD pattern illustrates the same copper crystal faces, {311}, {111}, and {001}, even after performing the heat treatment. That means, in the case of tantalum layer, the action of reducing the kinds of surface crystal orientation, which is provided by bonding to the tantalum layer, is not observed significantly after the heat treatment process. Therefore, it is interpreted as the main reason for resulting in a polycrystalline copper on the tantalum layer, where the polycrystalline copper features an intricate crystalline structure with a high density of crystal grain boundaries with various crystal faces of different face orientations.

Comparative Example 2

Similar to the first embodiment, a trench form interconnection groove 11 with an opening width of 32 nm is formed on the $SiO_2$ interlayer insulating layer 10 provided on a {001}-silicon (Si) substrate. On an upper surface of the interlayer insulating layer 10 and an inner surface of the interconnection groove 11, the copper layer and the manganese layer are deposited by the common high-frequency sputtering method. In this embodiment, the order of the stacking layers is changed from the first embodiment. The thickness of the copper layer is set to about 2 nm, which is the same as in the case of the first embodiment. Meanwhile, the thickness of the manganese layer is set to about 3 nm, which is thicker compared to the case of the first embodiment. This is mainly due to the fact that in this embodiment the manganese layer is positioned far from the surface of the insulting layer 10 for providing the copper interconnect structure.

Next, the multilayer structure, made of the copper layer and the manganese layer which are materials for forming the diffusion barrier layer 13, is heat treated for 30 minutes at 650K in argon gas flow at a flow rate of about 3.0 liter/minute. In this embodiment, the heat treatment process is performed in a higher temperature range and for a longer period of time compared to the case of the first embodiment. This is to surely form the diffusion barrier layer 13, which is mainly composed of manganese oxide, in the region in close proximity with the insulating layer 10 by sufficiently diffusing manganese towards the interlayer insulating layer 10, which is positioned, in this embodiment, far from the insulation layer through the copper layer.

After forming the diffusion barrier layer 13 by heat treating the multilayer structure, which is configured by reversing the stacking order compared to the first embodiment, the distribution of atomic concentration in the thickness direction of the diffusion barrier layer 13 is measured by the SIMS method. According to SIMS analysis, it is found that manganese diffuses and moves to a region in close proximity to the interface with the SiO2 insulating layer 10 and is concentrated in this region. Although there is a difference in the atomic concentration, the oxygen atoms inside of the diffusion barrier layer 13 show a similar state of distribution as manganese atoms. Meanwhile, it is shown that the copper is accumulated on the surface portion of the diffusion barrier layer 13. Further, even though the multilayer structure is formed by changing the deposition order, the micro X-ray diffraction pattern (XRD) shows that the surface portion of the diffusion barrier layer 13 is configured from copper crystal faces of {001} and {111}. Additionally, the XRD pattern after conducting the heat treatment shows that an intensity of {111} face is about ten times stronger than that of {002} diffraction peak (refer to FIG. 8).

Similar to the case of the first embodiment, copper constituting the interconnection body 14 is deposited on the diffusion barrier layer 13 by the electrolytic plating method using the layer mainly composed of copper as a copper seed layer. This is due to the fact that the surface portion of the diffusion barrier layer 13 is mainly composed of copper with two kinds of surface crystal orientation: {001} and {111} after conducting the heat treatment. Next, copper which is excessively formed on the interconnection groove 11 and the diffusion barrier layer 13 remained on the upper surface of the insulating layer 10 ($SiO_2$) are removed by chemical and mechanical polishing (CMP) method until they reach a level face identical to the upper surface of the insulating layer 10. Thereby, a single damascene type copper interconnection structure 1A is completed, as schematically shown in FIG. 10.

The internal structure of the copper interconnection body 14 is examined by a cross-sectional TEM method using a common HR-TEM. The number of crystal grain boundary contained in the copper interconnection body 14 is about $5/\mu m^2$ in area density, which is the same as in the case of the first embodiment. Further, the electrical resistivity of the copper interconnection body 14 is measured by the direct current four-probe method at room temperature. The result of this measurement shows a small value (2.2 μΩ·cm), as in the case of the first embodiment, which is close to the resistivity of pure bulk copper (1.7 μΩ·cm).

Embodiment 3

The third embodiment of the present invention is explained using an example, in which the diffusion barrier layer 13 is formed from a copper manganese (Cu—Mn) alloy layer.

First, a trench form interconnection groove 11 is formed on a SiOC layer, insulating layer 10 provided on the {001}-silicon substrate, with a thickness of 120 nm by common plasma etching method. The opening width of the interconnection groove 11 is set to 32 nm. Second, a copper-manganese (Cu—Mn) alloy layer is deposited onto an upper surface of the SiOC insulating layer 10 and an inner surface of the interconnection groove 11 by a common high-frequency sputtering method using the Cu—Mn alloy as a target, in which the atomic concentration of manganese is about 7 atom % in concentration. The thickness of the Cu—Mn alloy layer is set to be about 2 nm. The environmental pressure for forming the copper-manganese (Cu—Mn) alloy layer is set to be 0.1 Pascal (Pa).

Next, the copper-manganese (Cu—Mn) alloy layer is heated for 10 minutes at a temperature of about 610K (337° C.) in argon (Ar) gas flow to form the diffusion barrier layer 13. The flow rate of argon is set to be about 2.0 liter/minute. By this heat treatment, manganese atoms diffuses and accumulates in a concentrated manner in a region in close proximity to the SiOC insulating layer 10, thereby an amorphous layer made of manganese oxide containing carbon is formed with sufficient barrier properties. Meanwhile, the surface portion of the diffusion barrier layer 13 is formed as a layer mainly composed of copper, which contains more copper than manganese.

The surface crystal orientation of the copper-manganese (Cu—Mn) alloy layer before and after the heat treatment is analyzed using the XRD diffraction method. Before applying the heat treatment, the XRD pattern illustrates three kinds of copper crystal faces: {311}, {001} and {111}. Meanwhile, the XRD pattern shows that the kinds of copper surface orientations are reduced to two types: {001} and {111}, after applying the heat treatment. Additionally, according to the XRD analysis, the intensity of {111} diffraction peak is about ten times stronger than that of {002} diffraction peak.

Because the surface layer portion of the diffusion barrier layer 13 is mainly composed of copper and its surface crystal orientation is configured from {001} and {111} copper crystal faces, a buried copper, which constitutes the interconnection body 14, is deposited on the diffusion barrier layer 13 by the electrolytic plating method using the layer mainly composed of copper as a copper seed layer. After depositing the buried copper inside of the interconnection groove 11, the diffusion barrier layer 13 remained on the SiOC insulating layer 10 and copper excessively formed on the interconnection groove 11 are removed by the chemical and mechanical polishing (CMP) method until they reach the level face identical to the upper surface of the SiOC insulating layer 10. In this way, a single damascene type copper interconnection structure 1A is completed as shown schematically in FIG. 10.

The internal structure of the copper interconnection body 14 is examined by a cross-sectional TEM method using common HR-TEM. The number of crystal grain contained in the copper interconnection body 14 is $6/\mu m^2$ in area density. Furthermore, the electric resistivity of the copper interconnection body 14 is measured at room temperature by the direct current four-probe method. The result of this measurement shows low value about $2.0\ \mu\Omega\cdot cm$, which is close to the electric resistivity of pure bulk copper ($1.7\ \mu\Omega\cdot cm$).

Embodiment 4

The fourth embodiment of the present invention is explained with reference to FIG. 13 using an example in which the copper interconnection structure is provided with a double diffusion barrier layer formed from tantalum series and copper-manganese (Cu—Mn) alloy materials.

Figure 13:
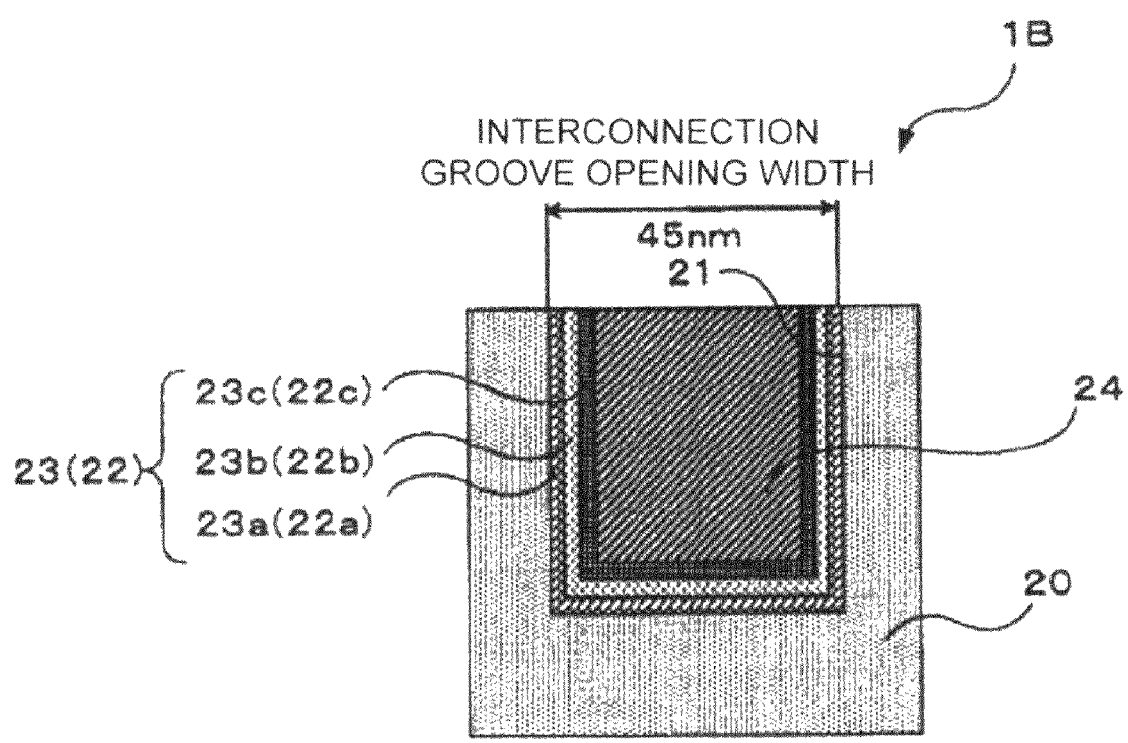
FIG. 13 illustrates a cross-sectional view of an alternative embodiment of a copper interconnection structure.

With reference to FIG. 13, a cross-sectional view of an alternative embodiment of copper interconnection structure is shown. In this embodiment, the diffusion barrier layer is formed from a multilayer structure 22 including the tantalum series layer 22a and 22b and the copper-manganese (Cu—Mn) alloy layer 22c in a damascene type copper interconnection structure 1B.

As schematically shown in FIG. 13, a trench form interconnection groove 21 with an opening width of 45 nm is formed on an insulating layer 20, SiON, with a thickness of about 150 nm on a {001}-silicon (Si) substrate, not shown in this figure, by a common plasma etching method. First, a tantalum nitride layer 22a is deposited onto the upper surface of the SiON insulating layer 20 and the inner surface of the interconnection groove 21 by a common reactive ion sputtering method using high purity tantalum as a target material and nitride ($N_2$) gas as a nitride source. The thickness of the tantalum nitride layer 22a is set to be about 2 nm. Next, a tantalum layer 22b with the thickness of about 2 nm is stacked on the tantalum nitride layer 22a by a common high-frequency sputtering method using high-purity tantalum as a target material.

Then, a copper-manganese (Cu—Mn) alloy layer 22c is deposited over the tantalum layer 22b forming a multilayer structure 22 used as materials for forming the diffusion barrier layer 23. The copper alloy layer 22c contains manganese (Mn) in a concentration range of 10 atom % and its thickness is set to be about 5 nm. The environmental pressure for forming the copper-manganese alloy layer 22c, by a common high-frequency sputtering method, is set to be about 0.07 Pascal (Pa).

Next, the multilayer structure 22 is heated for 7 minutes at a temperature of about 660K (387°) in Argon (Ar) gas flow, thereby the diffusion barrier layer 23 is formed. The flow rate of argon gas is set to be about 4.0 liter/minute. Using the common SIMS analysis, it is shown that manganese is diffused and accumulated in a concentrated manner toward the tantalum layer 22b inside the copper-manganese (Cu—Mn) alloy layer 22c. The concentration of oxygen atoms inside the copper-manganese (Cu—Mn) alloy layer 22c is about $4\times10^{18}$ $cm^{-3}$, which is lower compared to the case where the copper-manganese (Cu—Mn) alloy layer 12 is directly deposited on the insulating layer 10, SiON, and heat treated as in the case of third embodiment described above. In the region where the manganese atoms are accumulated, oxygen atoms showing similar concentration distribution are also accumulated. Therefore, an amorphous manganese oxide with a thickness of about 3 nm is formed in close proximity to the region where the manganese and oxygen atoms are accumulated.

Furthermore, it is shown that on the surface layer portion of the copper-manganese (Cu—Mn) alloy layer 23c, the atomic concentration of copper is increased which corresponds to the gradual decrease of the atomic concentration of the manganese towards the surface. It is also shown that the region of depth about 2 nm from the surface of the copper-manganese alloy layer 23c towards the tantalum layer 23b has become a layer mainly composed of copper. The surface crystal orientation of the multilayer structure 22 (diffusion barrier layer 23) is analyzed before and after the heat treatment using the XRD diffraction method. The results of XRD method confirm that the surface of the copper-manganese (Cu—Mn) alloy layer 22c, which constitutes the upper most layer of the multilayer structure 22 before the heat treatment, is configured from three kinds of copper crystal faces: {311}, {001}, and {111}. Meanwhile, the surface of the diffusion barrier layer 23 obtained by heat treating the multilayer structure 22 is configured from two kinds of copper crystal faces: {001} and {111}. Furthermore, the XRD analysis confirms that the intensity of {001} diffraction peak is about ten times higher than that of the {002} crystal face after applying the heat treatment.

Because the surface layer portion of the diffusion barrier layer 23 is mainly composed of copper and the surface crystal orientation is configured from {001} and {111} copper crystal faces after the heat treatment, a buried copper which constitutes the interconnection body 24 is deposited on the diffusion barrier layer 23 by electrolytic plating method using the layer mainly composed of copper as a copper seed layer. After depositing the buried copper inside of the interconnection groove 21, the multilayer structure 22 remained on the SiON insulating layer 20 and the copper excessively formed on the interconnection groove 21 are removed by the chemical and mechanical polishing (CMP) method until they reach the level face identical to the upper surface of the insulating layer 20. Thereby, a single damascene type copper interconnection structure 1B is completed as shown schematically in FIG. 13.

Internal structure of the copper interconnection body 24 is examined by the cross-sectional TEM method using common HR-TEM. The number of crystal grain boundary contained in the copper interconnection body 24 is 3/$\mu m^2$ in area density. Further, electric resistivity of the copper interconnection body 24 is measured at room temperature by the direct current four-probe method. The result of this measurement shows a low value about 2.1 $\mu\Omega\cdot cm$, which is close to the electric resistivity of pure bulk copper (1.7 $\mu\Omega\cdot cm$).

Embodiment 5

The fifth embodiment of the present invention is explained using an example, in which the copper interconnection structure is provided with the diffusion barrier layer, which is formed from a tantalum series layer, a manganese layer, and a copper layer.

In this embodiment, similar to the previous cases, a trench form interconnection groove 21 with an opening width of 45 nm is formed by a common plasma etching method on a so-called porous SiOC layer with void fraction of about 30% having a plurality of fine pores with the average pore diameter of about 2 nm to 3 nm. Thereafter, the damages resulted from the plasma etching are repaired using an organic silane based gas.

Thereafter, the tantalum nitride layer 22a with a thickness of about 2 nm, the tantalum layer 22b with a thickness of about 2 nm, and a manganese layer with a thickness of about 2 nm are deposited respectively on the upper surface of the SiOC insulating layer 20 and the inner surface of the interconnection groove 21 using the same methods as those described above in the fourth embodiment.

Next, the heat treatment process is performed for 30 minutes at a temperature of 650K (377° C.) in the argon (Ar) atmosphere containing 25 parts per million (vol.ppm) of oxygen in volume ratio. The rate of temperature increase from the room temperature to the heat treatment temperature of 650K is 8K per minute. Further, the average cooling speed from 650K to room temperature after the heat treatment is 10K per minute. By this heat treatment, the manganese layer is oxidized and converted into the amorphous manganese oxide layer realizing the barrier property.

After heat treating the manganese layer, a copper layer with a thickness of 3 nm is deposited over the manganese oxide layer to form the multilayer structure 22 using high purity (purity=6N) copper as a target by the high-frequency sputtering method. The total thickness of the copper-manganese (Cu—Mn) alloy film 22c, in this embodiment, is made to be about 5 nm. The environmental pressure for forming the copper-manganese alloy layer 22c, by the common high-frequency sputtering method, is set to be about 0.07 Pascal (Pa). Using the XRD analysis, it is confirmed that the surface of copper layer at the time of deposition is configured from three kinds of crystal faces: {311}, {001}, and {111}.

Thereafter, the multilayer structure 22 is heat treated for 10 minutes at a temperature of 650K in Argon (Ar) gas flow with the flow rate of 3.0 liter/minute. Similar to the previous embodiments, the XRD analysis confirms that the kinds of surface crystal orientation of copper, the uppermost layer of the multilayer structure 22, is reduced to two types, {111} and {001}, after this heat treatment. In addition, the XRD analysis illustrate that the intensity of X-ray diffraction peak of {111} face, after the heat treatment process, is about ten times higher than the intensity of X-ray diffraction peak of {200} face.

Next, a buried copper, which constitutes the interconnection body 24, is deposited on the barrier layer 23 by the common electrolytic plating method using the copper layer having the {001} and {111} crystal faces on its surface as a copper seed layer. The buried copper is provided so as to bury inside of the interconnection groove 21. After depositing the buried copper inside of the interconnection groove 21, the multilayer structure 22 remained on the SiOC insulating layer 20 and the copper excessively formed on the interconnection groove 21 are removed by the CMP method until they reach the level face identical to the upper surface of the insulting layer 20. In this way, a single damascene type copper interconnection structure 1B is completed as shown schematically in FIG. 13.

The internal structure of the copper interconnection body 24 is examined by a cross-sectional TEM method using common HR-TEM. The number of crystal grain boundary contained in the copper interconnection body 24 is 7/$\mu m^2$ in area density. Further, the electric resistivity of the copper interconnection body 24 is measured at room temperature by the direct current four-probe method. The result of this measurement shows a low value about 2.3 $\mu\Omega\cdot cm$, which is close to the electric resistivity of pure bulk copper (1.7 $\mu\Omega\cdot cm$).

Embodiment 6

The sixth embodiment of the present invention is explained using an example, in which the copper interconnection structure is provided with a diffusion barrier layer using a germanium (Ge) layer and a copper-manganese (Cu—Mn) alloy layer as materials.

Similar to the first embodiment, a trench form interconnection groove 11 with an opening width of 32 nm is formed on the $SiO_2$ insulating layer 10 provided on the {001}-silicon (Si) substrate. Onto the upper surface of the interlayer insulating layer 10 and the inner surface of the interconnection groove 11, a germanium (Ge) layer and copper-manganese (Cu—Mn) alloy layer are deposited in series by the common high-frequency sputtering method. The germanium layer is formed using the common high frequency sputtering method and its thickness is set to 2 nm.

In this embodiment, the copper-manganese (Cu—Mn) alloy layer is formed by the common high-frequency sputtering method using the (Cu—Mn) alloy as a target containing manganese in a concentration range of 7 atom %. The thickness of the copper-manganese (Cu—Mn) alloy layer is set to 5 nm, which is thicker compared to the case of the first embodiment. This is to further suppress the diffusion and intrusion of germanium into the surface layer portion of the copper-manganese (Cu—Mn) alloy layer considering the fact that germanium has relatively greater diffusion coefficient (the diffusion coefficient of Ge at 400° C. is $1.13 \times 10^{19}$ $cm^2/s$) compared to copper.

In the next step, the multilayer structure made of germanium layer and copper-manganese (Cu—Mn) alloy layer, which are materials for forming the diffusion barrier layer, is heat treated for one minute at 605K (332° C.) in argon gas flow at a flow rate of 1.0 liter/minute. In order to suppress the diffusion of germanium into the copper-manganese (Cu—Mn) alloy layer, the heat treatment is performed using a common infrared lamp annealing method which can reduce the heating time. The temperature is then increased from room temperature to 605K in five seconds. The lamp is then turned off one minute after the temperature reaches to its desired level, and the flow rate of the argon gas, which is circulated in the heat treatment environment, is increased to 8 liter/minute in order to promote the cooling of the multilayer structure 12.

After forming the diffusion barrier layer 13 by heating the multilayer structure 12, the distribution of atomic concentration in the thickness direction of the diffusion barrier layer 13 is measured by the SIMS method. According to the SIMS analysis, it is found that manganese diffuses and moves to a region in close proximity to the interface with the $SiO_2$ insulating layer 10 and is distributed in a concentrated manner in this region. Although there is a difference in the atomic concentration, oxygen atoms inside of the diffusion barrier layer 13 show similar state of distribution as manganese atoms. Based on the result of EELS analysis, it is determined that an amorphous manganese oxide is formed in the region where the manganese and oxygen atoms are accumulated. Further, germanium is also present in this region though its atomic concentration is less than that of manganese.

Meanwhile, it is shown that copper is accumulated on the surface portion of the diffusion barrier 13, opposite side of the interface between the barrier layer 13 and the SiO2 insulating layer 10. Further, the surface crystal orientation of the multilayer structure 12(13) is examined before and after the heat treatment process by the XRD analysis. This analysis shows that the surface of the copper-manganese (Cu—Mn) alloy layer is configured from copper crystal faces of $\{001\}$ and $\{111\}$ before the heat treatment. On the contrary, only the $\{111\}$ diffraction peak of copper is appeared in the XRD pattern of the copper-manganese (Cu—Mn) alloy layer after the heat treatment (refer to FIGS. 3 and 4).

After the heat treatment process, a buried copper, constituting the interconnection body 14, is deposited on the diffusion barrier layer 13, where its surface layer is mainly composed of copper with surface crystal orientation of $\{111\}$ face, by the electrolytic plating method using the layer mainly composed of copper as a copper seed layer. Next, the diffusion barrier layer 13 remained on the $SiO_2$ insulating layer 10 and the copper excessively formed on the interconnection groove 11 are removed by CMP method until they reach a level face identical to the upper surface of the insulating layer 10. Thereby, a single damascene type copper interconnection structure 1A is completed as schematically shown in FIG. 10.

The internal structure of the copper interconnection body 14 is examined by a cross-sectional TEM method using common HR-TEM. The number of crystal grain boundary contained in the copper interconnection body 14 is $7/\mu m^2$ in area density, which is lower compared to the case of the first embodiment. Meanwhile, the electric resistivity of the copper interconnection body 14v is measured by the direct current four-probe method at room temperature. The result of this measurement shows a low value, $2.5\ \mu\Omega\cdot cm$, which is higher than the case of the first embodiment but is lower than the resistivity of pure aluminum ($2.7\ \mu\Omega\cdot cm$). This higher resistivity may be interpreted, based on the SIMS analysis, as an intrusion of small amount of germanium ($<1\times10^{18}\ atom/cm^3$) into the interconnection body 14 such that the interconnection body 14 may not be configured from the pure bulk copper.

Embodiments of the copper interconnection structure pertaining to the present invention are low in the density of crystal grain boundaries and electrical resistivity, therefore they are favorable for effectively circulating the device operating current. Further, the copper interconnection structures of the present invention are also superior in EM resistance and are capable of avoiding the leakage of the device operating current. Therefore, they are favorable to be used for manufacturing electronic devices with low electric consumption and high operating reliability, such as liquid crystal display (LCD) devices, flat display panel (FDP) devices, organic electroluminescence (EL) devices, and inorganic EL devices.

Embodiments of the copper interconnection structure with a low density of crystal grain boundaries and low electrical resistance, pertaining to the present invention, may be formed in interconnections with an interconnection width of 45 nm, or fine interconnections with an interconnection width of 32 nm or less, with advanced technology node for new generation of interconnection structures. Therefore, these copper interconnection structures may be used to manufacture silicon USLI devices with an interconnection width of 45 nm or less, for example.

Furthermore, the copper interconnection structure pertaining to the present invention features a low electric resistance. Thus, these copper interconnection structures may be favorably used for manufacturing silicon semiconductor memories, such as a NAND type flash memory with a low RC delay.

What is claimed is:

1. A copper interconnection structure comprising:
    an insulating layer;
    an interconnection body including copper in an opening provided on the insulating layer; and
    a barrier layer, comprising a metal element and copper, formed between the insulating layer and the interconnection body, and wherein:
    an atomic concentration of the metal element in the barrier layer is accumulated toward an outer surface of the barrier layer facing the insulating layer, and an atomic concentration of copper in the barrier layer is accumulated toward an inner surface of the barrier layer facing the interconnection body, and
    the inner surface of the barrier layer comprises copper surface orientation of $\{111\}$ and $\{200\}$, and an intensity of X-ray diffraction peak from the inner surface of the barrier layer is stronger for the $\{111\}$ peak than for the $\{200\}$ peak;
    wherein the barrier layer comprises a first barrier layer and a second barrier layer,
    wherein the first barrier layer has a multilayer structure which comprises:
    a first layer comprising tantalum nitride formed on the insulating layer, and
    a second layer comprising tantalum formed over the first layer.

2. The copper interconnection structure of claim 1, wherein the barrier layer further comprises an atomic concentration of oxygen accumulated toward the outer surface of the barrier layer showing similar distribution as the atomic concentration of the metal element.

3. The copper interconnection structure of claim 1, wherein an enthalpy of oxide formation for the metal element is lower than the enthalpy of oxide formation for copper.

4. The copper interconnection structure of claim 3, wherein the metal element has a diffusion coefficient greater than a self diffusion coefficient of copper.

5. The copper interconnection structure of claim 1, wherein the metal element comprises at least one or more of magnesium (Mg), manganese (Mn), and aluminum (Al).

6. The copper interconnection structure of claim 1, wherein the intensity of X-ray diffraction peak from the inner surface of the barrier layer is about 10 times stronger for the $\{111\}$ peak than for the $\{200\}$ peak.

7. A semiconductor device comprising circuits which are interconnected with a copper interconnection structure as a circuit interconnection, wherein said copper interconnection structure is the copper interconnection structure of claim 1.

8. A copper interconnection structure comprising:
an insulating layer including silicon;
an interconnection body including copper in an opening provided on the insulating layer; and
a barrier layer formed between the insulating layer and the interconnection body, wherein the barrier layer comprises:
a first barrier layer comprising a first metal element having an enthalpy of oxide formation lower than the enthalpy of oxide formation for silicon, wherein the first barrier layer is formed on an inner surface of the opening, and
a second barrier layer, comprising a second metal element and copper, formed on the first barrier layer, and wherein:
an atomic concentration of the second metal element in the second barrier layer is accumulated toward an outer surface of the second barrier layer facing the first barrier layer, and an atomic concentration of copper in the second barrier layer is accumulated toward an inner surface of the second barrier layer facing the interconnection body, and
the inner surface of the second barrier layer comprises copper surface orientation of {111} and {200}, and an intensity of X-ray diffraction peak from the inner surface of the barrier layer is stronger for the {111} peak than for the {200} peak
wherein the first barrier layer has a multilayer structure which comprises:
a first layer comprising tantalum nitride formed on the insulating layer, and
a second layer comprising tantalum formed over the first layer.

9. The copper interconnection structure of claim 8, wherein the second barrier layer further comprises an atomic concentration of oxygen accumulated toward the outer surface of the second barrier layer showing similar distribution as the atomic concentration of the second metal element.

10. The copper interconnection structure of claim 8, wherein the first metal element comprises tantalum and at least one of scandium (Sc), titanium (Ti), vanadium (V), chrome (Cr), yttrium (Y), zirconium (Zr), niobium (Nb), antimony (Sb), hafnium (Hf), and rhenium (Re).

11. The copper interconnection structure of claim 10, wherein the first metal element comprises tantalum and titanium.

12. The copper interconnection structure of claim 8, wherein an enthalpy of oxide formation for the second metal element is lower than the enthalpy of oxide formation for copper.

13. The copper interconnection structure of claim 12, wherein the second metal element has a diffusion coefficient greater than a self diffusion coefficient of copper.

14. The copper interconnection structure of claim 8, wherein the second metal element comprises at least one or more of magnesium (Mg), manganese (Mn), and aluminum (Al).

15. The copper interconnection structure of claim 8, wherein the intensity of X-ray diffraction peak from the inner surface of the second barrier layer is about 10 times stronger for the {111} peak than for the {200} peak.

16. The copper interconnection structure of claim 8, wherein a total thickness of said first and second barrier layers is set to be not more than 12% of an interconnection width.

17. A semiconductor device comprising circuits which are interconnected with a copper interconnection structure as a circuit interconnection, wherein said copper interconnection structure is the copper interconnection structure of claim 8.

18. A copper interconnection structure comprising:
an insulating layer including silicon;
an interconnection body including copper, having an interconnection width in an opening provided on the insulating layer; and
a barrier layer formed between the insulating layer and the interconnection body, wherein the barrier layer comprises:
a first barrier layer comprising a first metal element having an enthalpy of oxide formation lower than the enthalpy of oxide formation for silicon, wherein the first barrier layer is formed on an inner surface of the opening, and
a second barrier layer, comprising a second metal element and copper, formed on the first barrier layer, and wherein:
an atomic concentration of the second metal element in the second barrier layer is accumulated toward an outer surface of the second barrier layer facing the first barrier layer, and an atomic concentration of copper in the second barrier layer is accumulated toward an inner surface of the second barrier layer facing the interconnection body, and
a total thickness of said first and second barrier layers is set to be not more than 12% of the interconnection width,
wherein the second metal element comprises germanium.

19. The copper interconnection structure of claim 18, wherein the inner surface of the second barrier layer comprises copper surface orientation of {111} and {200}.

20. The copper interconnection structure of claim 19, wherein an intensity of X-ray diffraction peak from the inner surface of the barrier layer is stronger for the {111} peak than for the {200} peak.

21. The copper interconnection structure of claim 20, wherein the intensity of X-ray diffraction peak from the inner surface of the barrier layer is about 10 times stronger for the {111} peak than for the {200} peak.

22. The copper interconnection structure of claim 18, wherein the second metal element further comprises at least one of magnesium (Mg), manganese (Mn), and aluminum (Al).

23. The copper interconnection structure of claim 18, wherein the inner surface of the barrier layer comprises copper surface orientation of {111}.

24. The copper interconnection structure of claim 18, wherein the second barrier layer further comprises an atomic concentration of oxygen accumulated toward the outer surface of the second barrier layer showing similar distribution as the atomic concentration of the second metal element.

25. The copper interconnection structure of claim 18, wherein an enthalpy of oxide formation for the second metal element is lower than the enthalpy of oxide formation for copper.

26. The copper interconnection structure of claim 25, wherein the second metal element has a diffusion coefficient greater than a self diffusion coefficient of copper.

* * * * *